(12) United States Patent
Lee

(10) Patent No.: US 10,587,256 B2
(45) Date of Patent: Mar. 10, 2020

(54) OPERATION METHOD OF SIGNAL RECEIVER, PULSE WIDTH CONTROLLER, AND ELECTRONIC DEVICE INCLUDING THE SAME

(71) Applicant: Samsung Electronics Co., Ltd., Suwon-si, Gyeonggi-do (KR)

(72) Inventor: Soomin Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/168,104

(22) Filed: Oct. 23, 2018

(65) Prior Publication Data
US 2019/0158082 A1    May 23, 2019

(30) Foreign Application Priority Data

Nov. 21, 2017  (KR) .................. 10-2017-0155874
May 4, 2018    (KR) .................. 10-2018-0051570

(51) Int. Cl.
| H03K 7/08 | (2006.01) |
| G11C 7/22 | (2006.01) |
| G11C 7/10 | (2006.01) |
| G11C 8/10 | (2006.01) |

(52) U.S. Cl.
CPC ............. *H03K 7/08* (2013.01); *G11C 7/1066* (2013.01); *G11C 7/1093* (2013.01); *G11C 7/222* (2013.01); *G11C 8/10* (2013.01); *G11C 7/1096* (2013.01); *G11C 2207/005* (2013.01)

(58) Field of Classification Search
CPC . G11C 7/00; G11C 7/222; H03K 3/00; H03K 3/017; H03K 5/00; H03K 5/151; H03K 5/1565; H03K 7/00; H03K 7/08; H03L 7/00; H03L 7/0812
USPC ........................................................ 327/175
See application file for complete search history.

(56) References Cited

U.S. PATENT DOCUMENTS

| 7,558,336 B2 | 7/2009 | Osaka et al. |
| 7,622,973 B2 | 11/2009 | Kim et al. |
| 8,040,776 B2 | 10/2011 | Fukuda et al. |
| 8,213,490 B2 | 7/2012 | Jang |
| 8,253,461 B2 | 8/2012 | Yuki et al. |
| 8,471,602 B2 | 6/2013 | Lee et al. |
| 8,837,571 B1 | 9/2014 | Ke et al. |
| 9,542,991 B1* | 1/2017 | Xie ............... G11C 11/4076 |
| 2006/0018407 A1* | 1/2006 | Osaka ................ H03K 5/082 375/316 |

* cited by examiner

*Primary Examiner* — Lincoln D Donovan
*Assistant Examiner* — Dave Mattison
(74) *Attorney, Agent, or Firm* — Harness, Dickey and Pierce, P.L.C.

(57) ABSTRACT

An operation method of a signal receiver includes sequentially receiving 0-th and first bits through one signal line, and adjusting a width of any one of a first high duration and a first low duration of a first signal corresponding to the first bit, based on values of the 0-th and first bits, when the values of the 0-th and first bits are identical to each other.

20 Claims, 21 Drawing Sheets

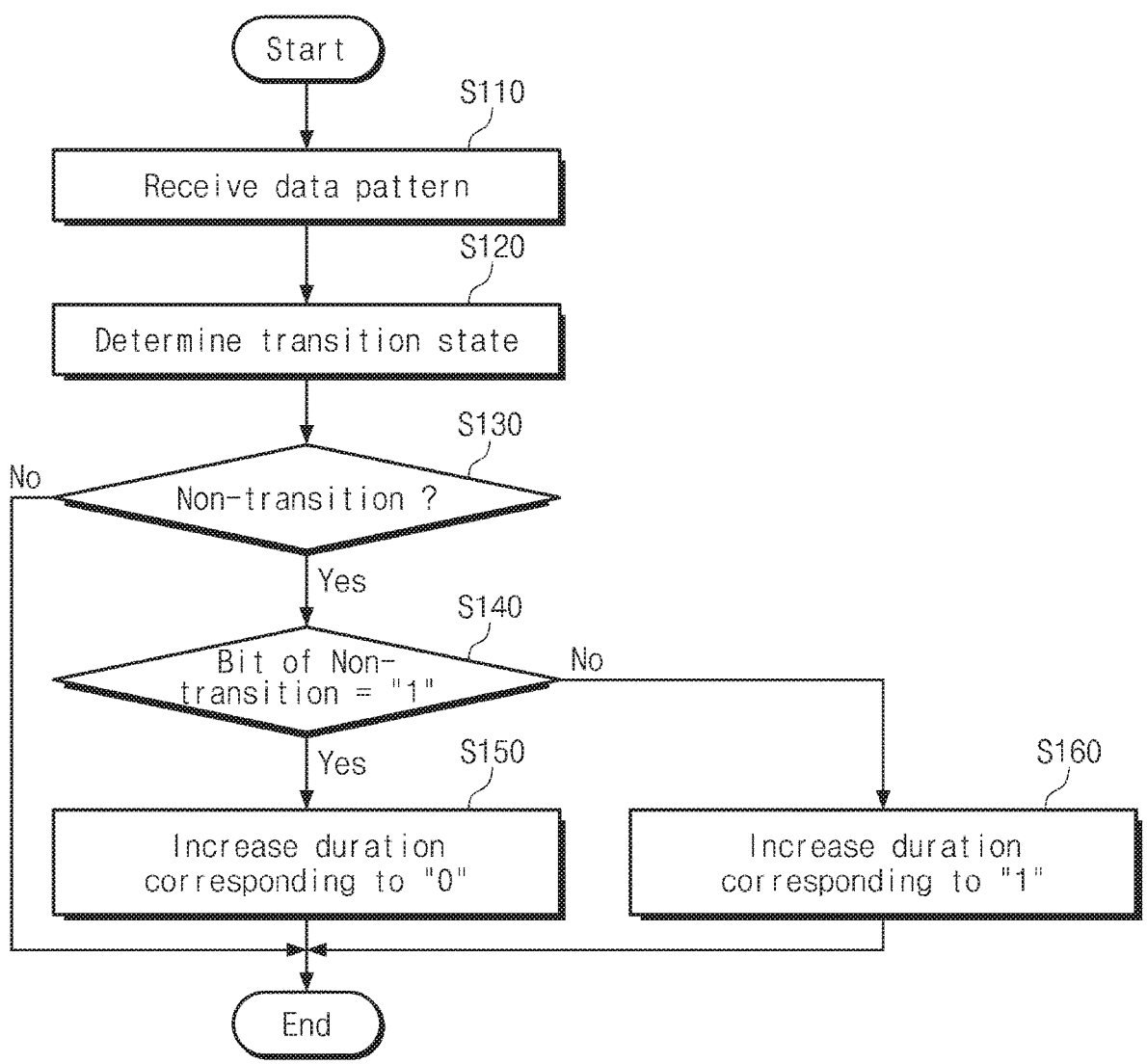

OPERATION METHOD OF SIGNAL RECEIVER, PULSE WIDTH CONTROLLER, AND ELECTRONIC DEVICE INCLUDING THE SAME

CROSS-REFERENCE TO RELATED APPLICATIONS

This application claims priority under 35 U.S.C. § 119 to Korean Patent Application Nos. 10-2017-0155874 filed on Nov. 21, 2017, and 10-2018-0051570 filed on May 4, 2018, in the Korean Intellectual Property Office, the disclosures of each of which are incorporated by reference herein in their entireties.

BACKGROUND

Example embodiments of the inventive concepts described herein relate to an electronic device, and more particularly, relate to an operation method of a signal receiver, a pulse width controller, and/or an electronic device including the signal receiver and the pulse width controller.

Electronic devices may exchange data with an external device (e.g., a memory controller) by transmitting an electrical signal to the external device through a signal line. For example, a semiconductor memory device may transmit data to the memory controller in synchronization with a data strobe signal. In this case, signals may be distorted depending on characteristics of lines between the semiconductor memory device and the memory controller. The signal distortion may cause a decrease in a data transmission speed and/or a decrease in data reliability.

SUMMARY

Example embodiments of the inventive concepts provide an operation method of a signal receiver having improved reliability by adjusting a pulse width of a data signal corresponding to a current data bit based on previous data bits, a pulse width controller, and/or an electronic device including the signal receiver and the pulse width controller.

According to an example embodiment, an operation method of a signal receiver includes sequentially receiving a 0-th bit and a first bit through a signal line; and selectively adjusting a width of one of a first high duration and a first low duration of a first signal corresponding to the first bit, based on values of the 0-th bit and first bit based on whether the values of the 0-th bit and the first bit are identical.

According to an example embodiment, a pulse width controller includes an interface configured to receive a signal; and processing circuitry configured to, sample an output signal to output a 0-th feedback signal, delay the 0-th feedback signal to output a first feedback signal, adjust a width of one of a high duration and a low duration of the output signal, when values of the 0-th feedback signal and the first feedback signal are identical.

According to an example embodiment, an electronic device includes a delay signal generator configured to sequentially receive a signal having a 0-th bit, a first bit and a second bit, and to delay the signal to generate a plurality of delay signals; and a pulse width controlled decision feedback equalizer configured to adjust a width of one of a high duration and a low duration of an output signal based on the plurality of delay signals when the 0-th bit and the first bit are identical or when the first bit and the second bit are identical.

According to an example embodiment, a signal transmitter includes a delay signal generator configured to receive a signal having a 0-th bit, a first bit and a second bit, and to generate a plurality of delay signals by delaying the signal; and a pulse width adjuster configured to, adjust a width of one of a high duration and a low duration of an output signal to generate an adjusted output signal, when the 0-th bit and the first bit are identical or when the first bit and the second bit are identical, and output the adjusted output signal to an external device through a data line.

BRIEF DESCRIPTION OF THE FIGURES

The above and other objects and features of the inventive concepts will become apparent by describing in detail some example embodiments thereof with reference to the accompanying drawings.

FIG. 3 is a flowchart illustrating an operation of a pulse width controller of FIGS. 1A and 1B.

DETAILED DESCRIPTION

Below, some example embodiments of the inventive concepts may be described in detail and clearly to such an extent that an ordinary one in the art easily implements the inventive concepts.

The terms "unit", "module", etc. to be used below and function blocks illustrated in drawings may be implemented in the form of a software component, a hardware component, or a combination thereof. Below, to describe the example embodiments of the inventive concepts clearly, a description associated with identical components will be omitted.

Figure 1A:
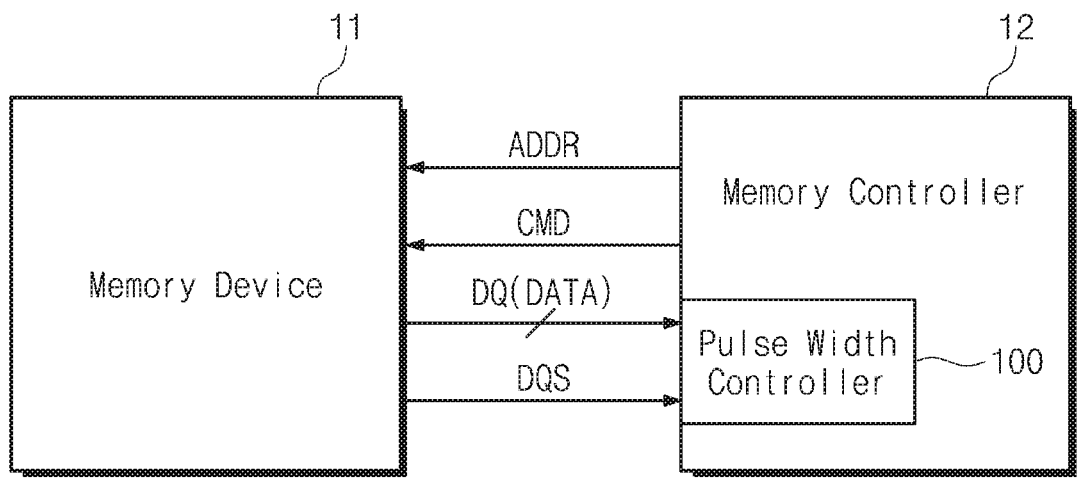
FIGS. 1A and 1B are block diagrams illustrating a memory system according to an example embodiment of the inventive concepts.
Figure 1B:
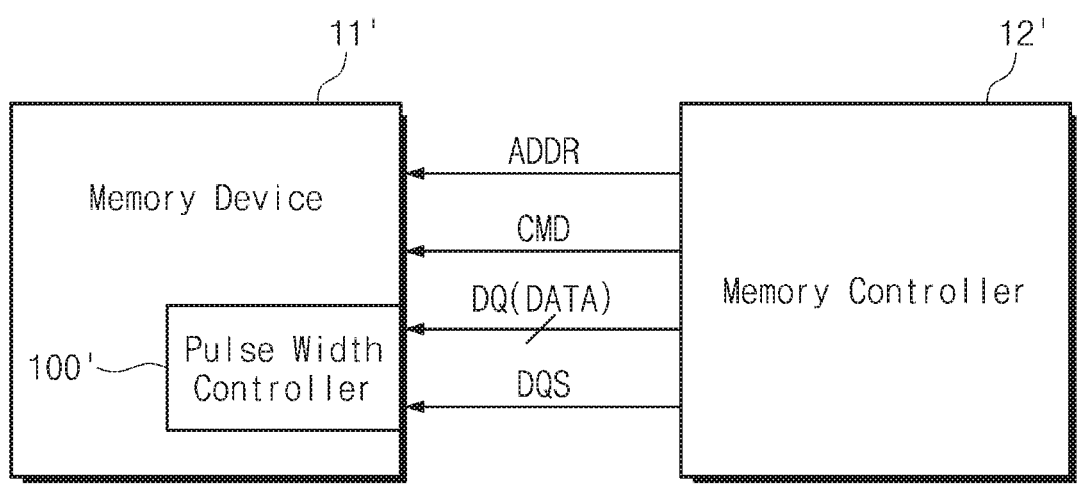

FIGS. 1A and 1B are block diagrams illustrating a memory system according to an example embodiment of the inventive concepts.

Referring to FIG. 1A, a memory system 10 may include a memory device 11 and a memory controller 12. The memory device may be a dynamic random access memory (DRAM) device. However, the inventive concepts are not limited thereto. For example, the memory device 11 may be a volatile memory device or a nonvolatile memory device.

Under control of the memory controller 12, the memory device 11 may store data "DATA" and/or may transmit the stored data "DATA" to the memory controller 12. For example, the memory device 11 may transmit data "DATA" to the memory controller 12 in response to a command CMD and an address ADDR from the memory controller 12. In this case, the memory device 11 may provide the data "DATA" to the memory controller 12 in response to a data strobe signal provided through a data strobe line DQS. In an example embodiment, the data "DATA" may be exchanged between the memory device 11 and the memory controller 12 through a plurality of data lines DQ and the data strobe line DQS.

The memory controller 12 may receive the data "DATA" from the memory device 11 through the data lines DQ. For example, the memory controller 12 may identify the data "DATA" received through the data lines DQ based on a signal of the data strobe line DQS.

In an example embodiment, the memory device 11 and the memory controller 12 may communicate with each other based on a double data rate (DDR) interface. However, the inventive concepts are not limited thereto. For example, the memory device 11 and the memory controller 12 may communicate with each other based on at least one of various interfaces such as a universal serial bus (USB) interface, a multimedia card (MMC) interface, a peripheral component interconnection (PCI) interface, a PCI-express (PCI-E) interface, an advanced technology attachment (ATA) interface, a serial-ATA (SATA) interface, a parallel-ATA (PATA) interface, a small computer small interface (SCSI) interface, an enhanced small disk interface (ESDI), an integrated drive electronics (IDE) interface, a mobile industry processor interface (MIPI), a nonvolatile memory-express (NVM-e) interface, and a NAND interface.

The memory controller 12 may include a pulse width controller 100. The pulse width controller 100 may be configured to adjust a pulse width corresponding to a current data bit based on data received from the memory device 11. For example, the pulse width controller 100 may adjust a pulse width corresponding to a current data bit based on a pattern of the received data. Alternatively, the pulse width controller 100 may adjust a pulse width corresponding to a current data bit based on whether previously received data bits are changed. An operation method and a structure of the pulse width controller 100 according to an example embodiment of the inventive concepts will be more fully described with reference to the following drawings.

Referring to FIG. 1B, a memory system 10' may include a memory device 11' and a memory controller 12'. Unlike the embodiment of FIG. 1A, in an example embodiment of FIG. 1B, a pulse width controller 100' may be included in the memory device 11', and may be configured to adjust a pulse width corresponding to a current data bit based on data received by the memory device 11'. Other components are similar to those of FIG. 1A, and thus, additional description will be omitted to avoid redundancy.

As described above, the pulse width controller 100 may adjust a pulse width corresponding to a current data bit based on previous data bits. As such, an effective margin for identifying a data bit may be sufficiently secured at a receive stage of the memory controller 12. Accordingly, the memory controller 12 which supports a high-speed interface may normally receive data from the memory device 11, and thus, the reliability of the memory controller 12 is improved.

Below, for convenience of description, example embodiments of the inventive concepts will be described with reference to the pulse width controller 100 (i.e., the embodiment of FIG. 1A) applied to the memory controller 12. In an example embodiment, the above-described configurations of the memory device 11 and the memory controller 12 are only to describe example embodiments of the inventive concepts. However, example embodiments of the inventive concepts are not limited thereto. For example, the pulse width controller 100 according to the inventive concepts may be applied to a signal transmitter, a signal receiver, or various electronic devices (e.g., a memory device) configured to transmit/receive various information through a signal line. Also, the pulse width controller 100 according to the inventive concepts may be used for a data line or to receive or transmit various signals as well as a data signal.

Figure 2A:
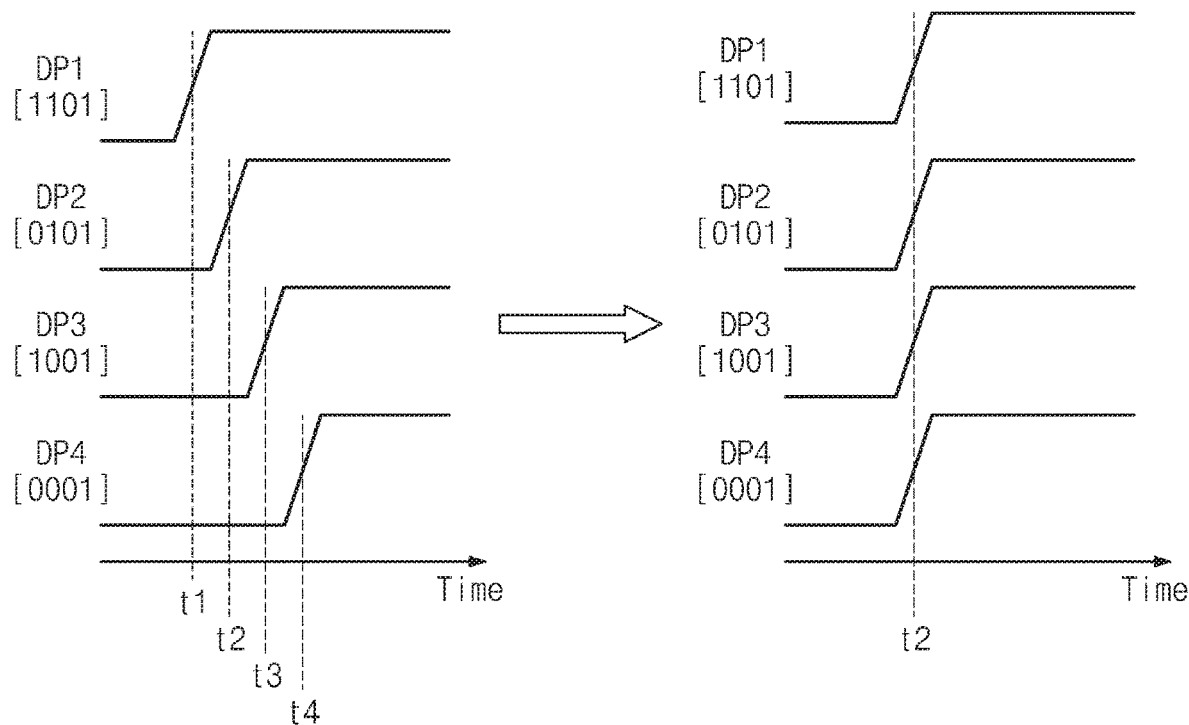
FIGS. 2A and 2B are timing diagrams illustrating data signals according to various data patterns.
Figure 2B:
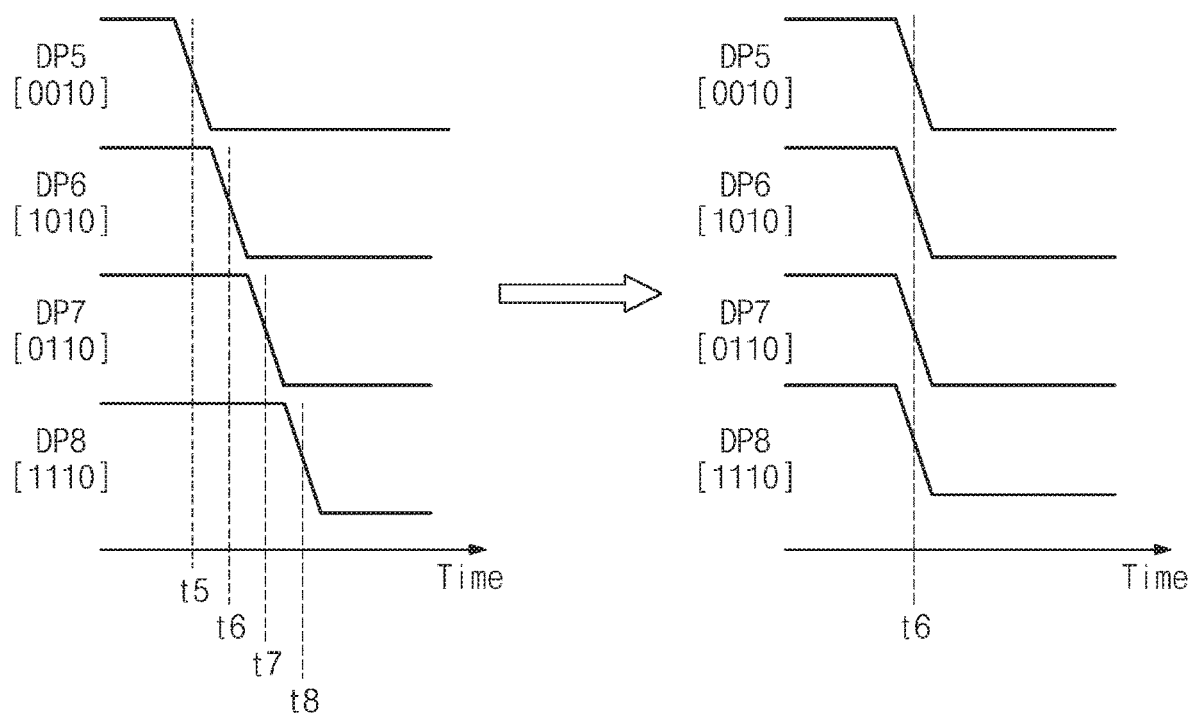

FIGS. 2A and 2B are timing diagrams illustrating data signals according to various data patterns. Below, also, to describe the technical idea of the inventive concepts clearly, example embodiments of the inventive concepts will be described with reference to a data signal or a data pattern received through one data line DQ.

Also, it is assumed that a data bit of "1" indicates a data signal of logical high and a data bit of "0" indicates a data signal of logical low. A data pattern DP means a combination of data bits sequentially received through one data line DQ. However, example embodiments of the inventive concepts are not limited thereto.

Referring to FIGS. 1A, 1B, 2A, and 2B, the memory controller 12 may receive various data patterns DP1 to DP8 from the memory device 11. For example, as illustrated in FIGS. 2A and 2B, the memory controller 12 may receive the first to eighth data patterns DP1 to DP8 from the memory device 11. The first to fourth data patterns DP1 to DP4 may respectively indicate patterns of "1101", "0101", "1001", and "0001", and the fifth to eighth data patterns DP5 to DP8 may respectively indicate patterns of "0010", "1010", "0110", and "1110".

In an example embodiment, the timing diagrams illustrated in FIGS. 2A and 2B shows data signals corresponding to a third bit and a fourth bit in the first to eighth data patterns DP1 to DP8. That is, data signals of the first to fourth data patterns DP1 to DP4, which are changed from a data bit of "0" to a data bit of "1", are illustrated in FIG. 2A, and data signals of the fifth to eighth data patterns DP5 to DP8, which are changed from a data bit of "1" to a data bit of "0", are illustrated in FIG. 2B.

As illustrated in FIG. 2A, in the case of the first to fourth data patterns DP1 to DP4, the data signals may rise at first to fourth time points t1 to t4, respectively. As illustrated in FIG. 2B, in the case of the fifth to eighth data patterns DP5 to DP8, the data signals may fall at fifth to eighth time points t5 to t8, respectively.

That is, a rising time point and a falling time point of a data signal may be different from each other depending on a data pattern (or a previous data bit). The difference between the rising time point and the falling time point may make it difficult to secure an effective margin of each data bit. As such, the memory controller 12 cannot normally receive data.

As illustrated in FIGS. 2A and 2B, the pulse width controller 100 according to an example embodiment of the inventive concepts may adjust a pulse width of a data signal corresponding to a current data bit based on a data pattern (or previous data bits). For example, in the case of each of the first to fourth data patterns DP1 to DP4, the pulse width controller 100 may adjust a pulse width of a data signal corresponding to a current data bit or a next data bit such that the data signal rises (e.g., is closer to a logical one than a logical zero) at the second time point t2. Alternatively, in the case of each of the fifth to eighth data patterns DP5 to DP8, the pulse width controller 100 may adjust a pulse width of a data signal corresponding to a current data bit or a next data bit such that the data signal falls (e.g., is closer to a logical zero than a logical one) at the sixth time point t6.

In an example embodiment, the second time point t2 may indicate a rising time point of a data signal corresponding to the second data pattern DP2 of "0101", and the sixth time point t6 may indicate a falling time point of a data signal corresponding to the sixth data pattern DP6 of "1010". In other words, the pulse width controller 100 may adjust a pulse width of a data signal with regard to a rising time point and a falling time point of a data signal according to a specific data pattern. In an example embodiment, the specific data pattern may indicate a pattern (i.e., "0101" or "1010") in which a data bit is changed every period.

FIG. 3 is a flowchart illustrating an operation of the pulse width controller 100 of FIGS. 1A and 1B.

Below, for convenience of description, the term "state of a data bit or a data pattern" is used. The "state of a data bit" indicates whether a specific data bit or a previous data bit of the specific data bit is changed. That is, in the case where a state of a first data bit indicates a transition state, the first data bit and an immediately previous data bit (i.e., a previous data bit) of the first data bit may be different from each other. That is, in the case where the state of the first data bit indicates a non-transition state, the first data bit and the immediately previous data bit (i.e., the previous data bit) of the first data bit may be identical to each other. In other words, a transition state of a data bit indicates whether a change is made between data bits adjacent to each other (temporally).

Below, for convenience of description, it is assumed that the pulse width controller 100 sequentially receives four data bits included in a data pattern and adjusts a pulse width of a third data bit of the four data bits. In other words, depending on an operation method to be described below, the pulse width controller 100 may control a pulse width of a data signal between a third data bit and a fourth data bit.

The above-described terms and assumptions may be to describe example embodiments of the inventive concepts easily, and the inventive concepts are not limited thereto.

Referring to FIGS. 1A, 1B, and 3, in operation S110, the pulse width controller 100 may receive a data pattern. For example, the pulse width controller 100 may receive various data patterns (e.g., the first to eighth data patterns DP1 to DP8). Alternatively, the pulse width controller 100 may sequentially receive a plurality of data bits.

In operation S120, the pulse width controller 100 may determine a transition state of each data bit based on the received data pattern. For example, in the case where the pulse width controller 100 receives the second data pattern DP2 (i.e., "0101") (refer to FIG. 2A), since adjacent data bits are all changed, a state of each data bit of the second data pattern DP2 may be a transition state.

In contrast, in the case where the pulse width controller 100 receives the third data pattern DP3 (i.e., "1001"), since second and third data bits are "0", a state of the third data bit may be a non-transition state.

In operation S130, the pulse width controller 100 may determine whether a data bait is in a non-transition state. In other words, the pulse width controller 100 may determine that adjacent data bits in the received data pattern have the same value.

In the case where a data bit of the non-transition state exists, in operation S140, the pulse width controller 100 may determine whether the data bit of the non-transition state is "1" or "0".

In the case where the data bit of the non-transition state is "1", in operation S150, the pulse width controller 100 may increase a duration corresponding to a data bit of "0". For example, in the case where the pulse width controller 100 receives the seventh data pattern DP7 (i.e., "0110"), since a second data bit and a third data bit adjacent to the second data bit are "1", a data bit of the non-transition state may be "1". In this case, the pulse width controller 100 may increase a pulse width of a duration (a low duration) corresponding to a data bit of "0" or may decrease a pulse width of a duration (i.e., a high duration) corresponding to a data bit of "1". In this case, like the seventh data pattern DP7 illustrated in FIG. 2B, a falling time point from a third data bit to a fourth data bit may be aligned at the sixth time point t6.

In the case where the data bit of the non-transition state is "0", in operation S150, the pulse width controller 100 may increase a duration corresponding to a data bit of "1". For example, in the case where the pulse width controller 100 receives the third data pattern DP3 (i.e., "1001"), since a second data bit and a third data bit adjacent to the second data bit are "0", a data bit of the non-transition state may be "0". In this case, the pulse width controller 100 may increase a pulse width of a duration (a high duration) corresponding to a data bit of "1" or may decrease a pulse width of a duration (i.e., a low duration) corresponding to a data bit of "0". In this case, like the third data pattern DP3 illustrated in FIG. 2A, a rising time point from a third data bit to a fourth data bit may be aligned at the second time point t2.

In the case where a data bit of the non-transition state does not exist, the pulse width controller 100 may not perform a pulse width control operation. For example, in the case where the pulse width controller 100 receives the second data pattern DP2 of "0101", since each data bit of the second data pattern DP2 has a value different from a value of an adjacent data bit, each data bit may have the transition state. In this case, the pulse width controller 100 may not perform a separate pulse width control operation.

As described above, the pulse width controller 100 according to an example embodiment of the inventive concepts may determine adjacent data bits having the same value are present in received data bits. In the case where adjacent data bits having the same value are present in received data bits, a high duration or a low duration of a current time point is increased or decreased based on a data bit of the same value.

In an example embodiment, the pulse width controller 100 according to an example embodiment of the inventive concepts may adjust (e.g., increase) a width of a high duration or a width of low duration depending on the number of adjacent data bits having the same value.

Figure 4A:
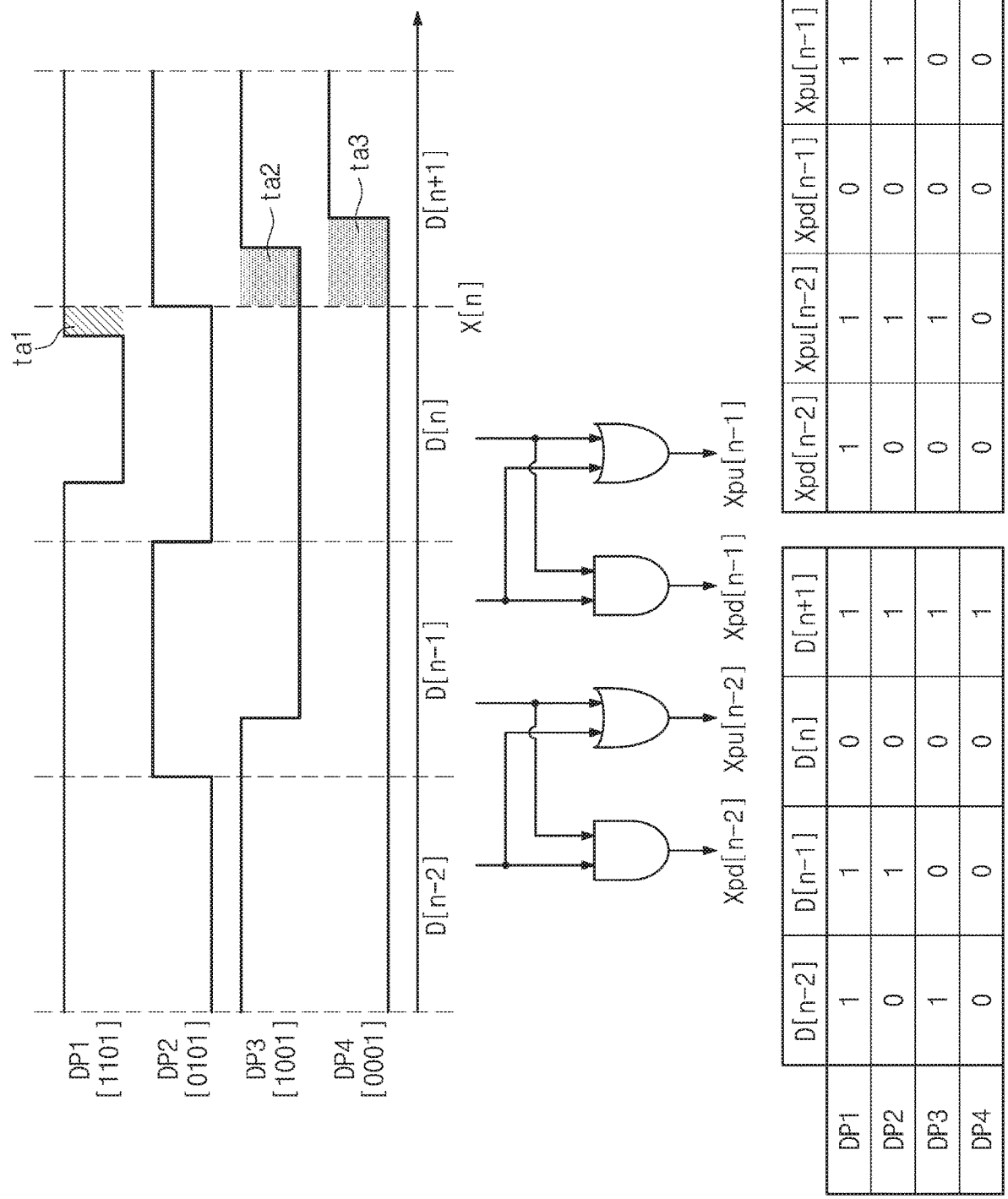
FIGS. 4A and 4B are diagrams for describing an operation method of FIG. 3 in detail.
Figure 4B:
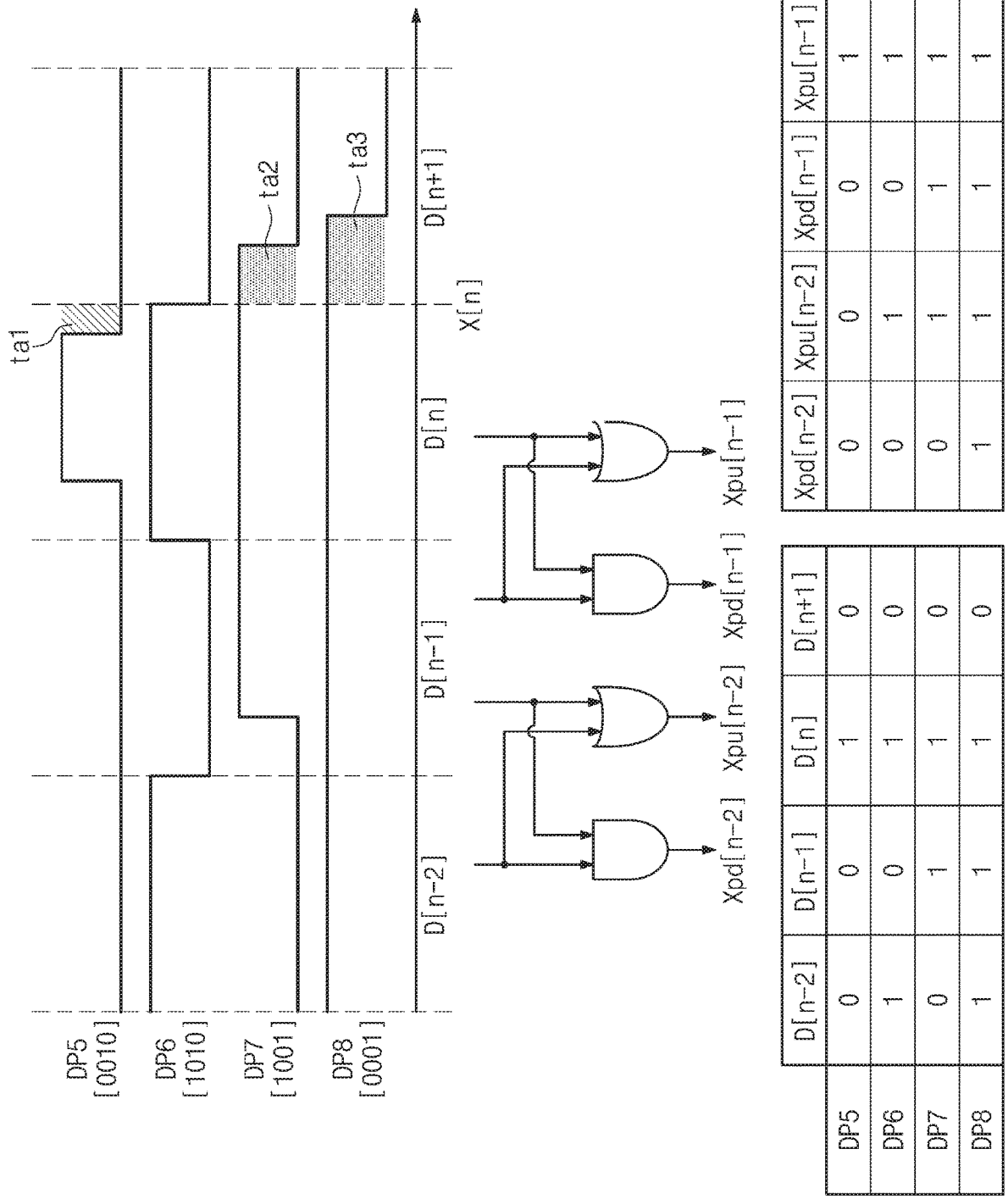

FIGS. 4A and 4B are diagrams for describing an operation method of FIG. 3 in detail. An example embodiment of the data patterns DP1 to DP4 in which a current data bit D[n] is "0" will be described with reference to FIG. 4A, and an example embodiment of the data patterns DP5 to DP8 in which the current data bit D[n] is "1" will be described with reference to FIG. 4B. In each of the data patterns DP1 to DP8, the current data bit D[n] indicates a third data bit.

Also, for convenience of description, a pulse width control operation of a point X[n] will be described. The point X[n] may indicate a point where a change from the current data bit D[n] to a next data bit D[n+1] is made. That is, the pulse width controller 100 may increase/decrease a pulse width of a high duration or a low duration at the point X[n].

As illustrated in FIGS. 4A and 4B, the pulse width controller 100 may receive the first to eighth data patterns DP1 to DP8. A data signal may have a signal level corresponding to a data bit of each of the data patterns DP1 to DP4.

In an example embodiment, the second data pattern DP2 or the sixth data pattern DP6 may have an ideal signal level in a duration of each data bit. For example, the second data pattern DP2 and the sixth data pattern DP6 may include data bits which are periodically repeated (or changed). That is, the second data pattern DP2 and the sixth data pattern DP6 may have a data signal (i.e., a high level or a low level) which is periodically changed in durations of second and first previous data bits D[n−2] and D[n−1], the current data bit D[n], and the next data bit D[n+1].

In contrast, the remaining data patterns DP1, DP3, DP4, DP5, DP7, and DP8 may have a data signal having a phase which is advanced or delayed with respect to the second and sixth data patterns DP2 and DP6.

For example, in the case of the first data pattern DP1, a pulse width may be decreased by a first time ta1 with respect to the point X[n]. In other words, in the case of the first data pattern DP1, a data signal may rise earlier than the point X[n] by the first time ta1. In contrast, in the case of the third data pattern DP3, a pulse width may be increased by a second time ta2 with respect to the point X[n]. In other words, in the case of the third data pattern DP3, a data signal may rise after the second time ta2 with respect to the point X[n]. In the case of the fourth data pattern DP4, a pulse width may be increased by a third time ta3 with respect to the point X[n]. In other words, in the case of the fourth data pattern DP4, a data signal may rise after the third time ta3 with respect to the point X[n].

The pulse width controller 100 according to example embodiments of the inventive concepts may increase/decrease a pulse width of a low duration/high duration by the first time ta1 in the case of the first data pattern DP1, may increase/decrease a pulse width of a high duration/low duration by the second time ta2 in the case of the third data pattern DP3, and may increase/decrease a pulse width of a high duration/low duration by the third time ta3 in the case of the fourth data pattern DP4.

For example, in the case of the first data pattern DP1 of "1101", first and second previous data bits D[n−1] and D[n−2] have the same value, that is, "1". That is, the first data pattern DP1 includes a data bit of "1" as a data bit of the non-transition state. In this case, as described with reference to FIG. 3, the pulse width controller 100 may increase a pulse width (i.e., a width of a low duration) corresponding to the data bit of "0", at the current time point X[n].

In the case of the third data pattern DP3 of "1001", a second previous data bit D[n−2] and a current data bit D[n] have the same value, that is, "0". That is, the third data pattern DP3 includes a data bit of "0" as a data bit of the non-transition state. In this case, as described with reference to FIG. 3, the pulse width controller 100 may increase a pulse width (i.e., a width of a high duration) corresponding to the data bit of "1", at the current time point X[n].

In the case of the fourth data pattern DP4 of "0001", first and second previous data bits D[n−1] and D[n−2], and a current data bit D[n] have the same value, that is, "0". That is, the fourth data pattern DP4 includes a data bit of "0" as a data bit of the non-transition state. In this case, as described with reference to FIG. 3, the pulse width controller 100 may increase a pulse width (i.e., a width of a high duration) corresponding to the data bit of "1", at the current time point X[n].

In an example embodiment, the third and fourth data patterns DP3 and DP4 may include data bits of "0" as a data bit of the non-transition state, but pulse widths to be adjusted may be different from each other. For example, the number of data bits of "0" included in the third data pattern DP3 as a data bit of the non-transition state is "1", and the number of data bits of "0" included in the fourth data pattern DP4 as a data bit of the non-transition state is "2".

That is, the third and fourth data patterns DP3 and DP4 may include data bits of "0" as a data bit of the non-transition state, but the number of data bits of the non-transition state included in the third data pattern DP3 may be different from the number of data bits of the non-transition state included in the fourth data pattern DP4. The pulse width controller 100 according to example embodiments of the inventive concepts may adjust pulse width adjustment based on the number of data bits of the non-transition state. In an example embodiment, the pulse width adjustment may increase as the number of data bits of the non-transition state increases.

The principle of adjusting pulse widths of the fifth to eighth data patterns DP5 to DP8 is identical to that associated with the first to fourth data patterns DP1 to DP4 except that data bits of the fifth to eighth data patterns DP5 to DP8 are different from data bits of the first to fourth data patterns DP1 to DP4, and thus, additional description will be omitted to avoid redundancy.

As described above, in each data pattern, a state of each data bit may be determined based on a combination of the current data bit D[n], the first previous data bit D[n−1], and the second data bit D[n−2].

For example, the pulse width controller 100 may perform an AND operation and an OR operation on the current data bit D[n], the first previous data bit D[n−1], and the second previous data bit D[n−2] and may generate a first pull-up bit Xpu[n−1], a first pull-down bit Xpd[n−1], a second pull-up bit Xpu[n−2], and a second pull-down bit Xpd[n−2].

The first pull-up bit Xpu[n−1] may be a value obtained by performing the OR operation on the current data bit D[n] and the first previous data bit D[n−1], the first pull-down bit Xpd[n−1] may be a value obtained by performing the AND operation on the current data bit D[n] and the first previous data bit D[n−1], the second pull-up bit Xpu[n−2] may be a value obtained by performing the OR operation on the first previous data bit D[n−1] and the second previous data bit D[n−2], and the second pull-down bit Xpd[n−2] may be a value obtained by performing the AND operation on the first previous data bit D[n−1] and the second previous data bit D[n−2]. Results of performing the AND operation and the OR operation on the data patterns DP1 to DP8 are illustrated in FIGS. 4A and 4B, and a description thereof will be omitted.

The pulse width controller 100 may increase a low duration based on the first and second pull-down bits Xpd[n−1] and Xpd[n−2]. For example, as illustrated in FIGS. 4A and 4B, at least one of the first pull-down bit Xpd[n−1] or the second pull-down bit Xpd[n−2] associated with each of the first, seventh, and eighth data patterns DP1, DP7, and DP8 may be "1", and the first pull-down bit Xpd[n−1] and the second pull-down bit Xpd[n−2] associated with each of the remaining data patterns DP2, DP3, DP4, DP5, and DP6 may be "0". In this case, the pulse width controller 100 may increase a pulse width of a data signal (i.e., a low duration) corresponding to a low level, at the point X[n], with regard to the first, seventh, and eighth data patterns DP1, DP7, and DP8.

In contrast, the pulse width controller 100 may increase a high duration based on the first and second pull-up bits Xpu[n−1] and Xpu[n−2]. For example, as illustrated in FIGS. 4A and 4B, at least one of the first pull-up bit Xpu[n−1] or the second pull-up bit Xpu[n−2] associated with each of the third, fourth, and fifth data patterns DP3, DP4, and DP5 may be "0", and both the first pull-up bit Xpu[n−1] and the second pull-up bit Xpu[n−2] associated with each of the remaining data patterns DP1, DP2, DP6, DP7, and DP8 may be "1". In this case, the pulse width controller 100 may increase a pulse width of a data signal (i.e., a high duration) corresponding to a high level, at the point X[n], with regard to the third, fourth, and fifth data patterns DP3, DP4, and DP5.

As described above, the pulse width controller 100 may adjust a pulse width at a specific point (e.g., X[n]) based on a data pattern (i.e., a current data bit and previous data bits). As such, since an effective margin for data identification at the memory controller 12 increases, the memory controller 12 having improved reliability is provided.

In an example embodiment, the operation method described with reference to FIGS. 4A and 4B are to describe the principle of adjusting a pulse width, and the inventive concepts are not limited thereto. The example embodiments of the inventive concepts may be variously changed or modified without departing from the scope and spirit of the inventive concepts.

In the above-described example embodiments, the current data bit D[n] and two previous data bits D[n−1] and D[n−2] are used to adjust a pulse width at the current time point X[n], however, the inventive concepts are not limited thereto. The pulse width controller 100 may use a current data bit and "k" previous data bits D[n] to D[n−k] (k being an integer) for the purpose of adjusting a pulse width at the current time point X[n].

Figure 5:
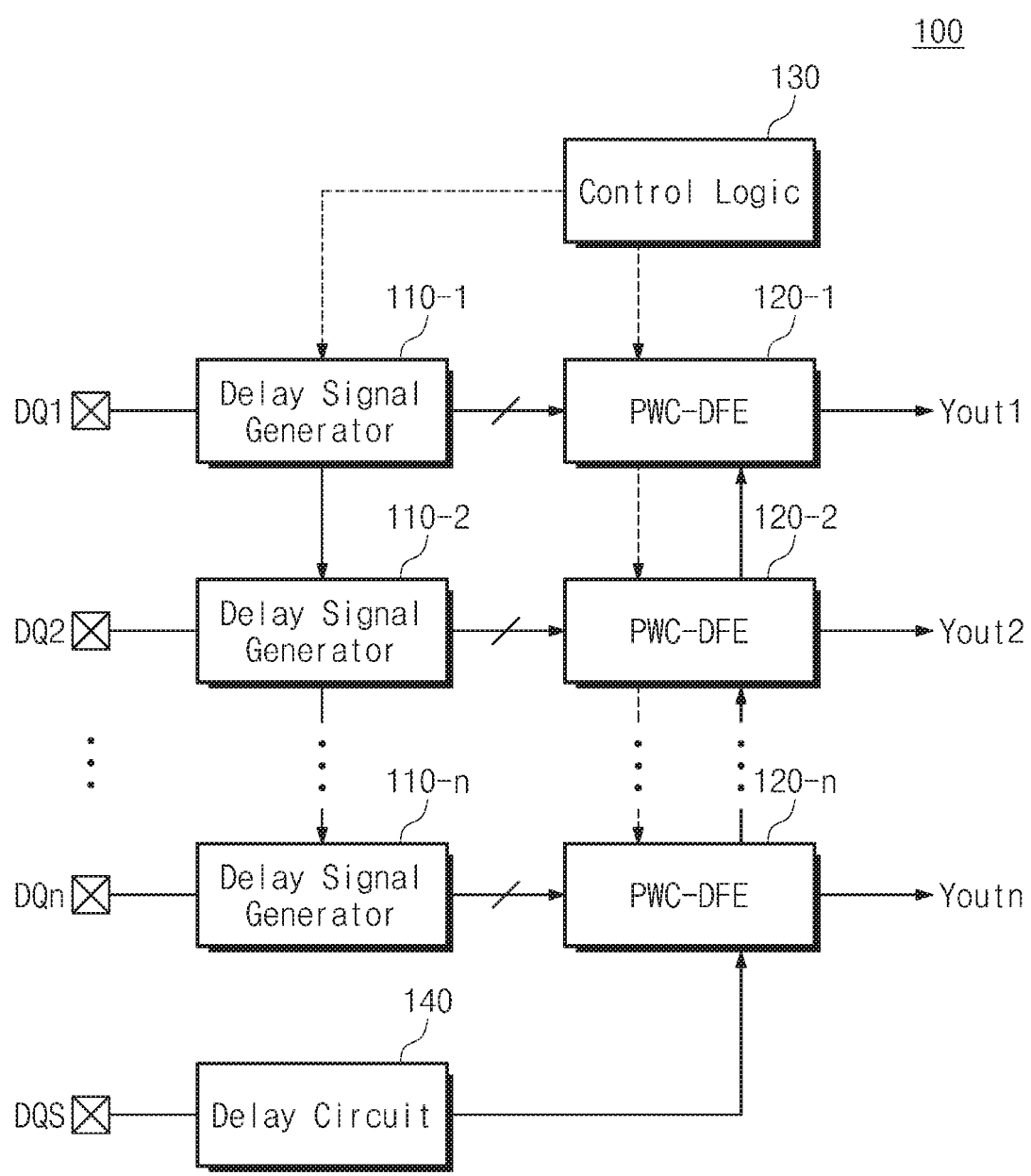
FIG. 5 is a block diagram illustrating a hardware configuration of a pulse width controller of FIGS. 1A and 1B.

FIG. 5 is a block diagram illustrating a hardware configuration of the pulse width controller 100 of FIGS. 1A and 1B. For a brief description, components that are unnecessary to describe a structure and an operation of the pulse width controller 100 will be omitted.

Referring to FIGS. 1A, 1B, and 5, the pulse width controller 100 may include a plurality of delay signal generators 110-1 to 110-n, a plurality of pulse width controlled decision feedback equalizers 120-1 to 120-n (hereinafter referred to as "PWC-DFE"), control logic 130, and a delay circuit 140.

The plurality of delay signal generators 110-1 to 110-n may receive data "DATA" from the memory device 11 through a plurality of data lines DQ1 to DQn, and may output a plurality of delay signals based on the received data "DATA".

The plurality of PWC-DFEs 120-1 to 120-n may respectively receive the plurality of delay signals from the plurality of delay signal generators 110-1 to 110-n, and may output a plurality of output signals Yout1 to Youtn based on the received delay signals.

The control logic 130 may control the plurality of delay signal generators 110-1 to 110-n and the plurality of PWC-DFEs 120-1 to 120-n. For example, the control logic 130 may provide delay coefficients for generating the plurality of delay signals to the plurality of delay signal generators 110-1 to 110-n, and may provide adjustment coefficients for adjusting a pulse width to the plurality of PWC-DFEs 120-1 to 120-n.

In an example embodiment, the plurality of delay signal generators 110-1 to 110-n may generate the plurality of delay signals based on the delay coefficients from the control logic 130, and each of the plurality of PWC-DFEs 120-1 to 120-n may adjust a pulse width of a data signal corresponding to a current data bit based on the adjustment coefficients from the control logic 130 and previous data bits.

The delay circuit 140 may be configured to delay a signal received through the data strobe line DQS. The plurality of PWC-DFEs 120-1 to 120-n may respectively output the output signals Yout1 to Youtn based on a delay signal from the delay circuit 140.

Figure 6:
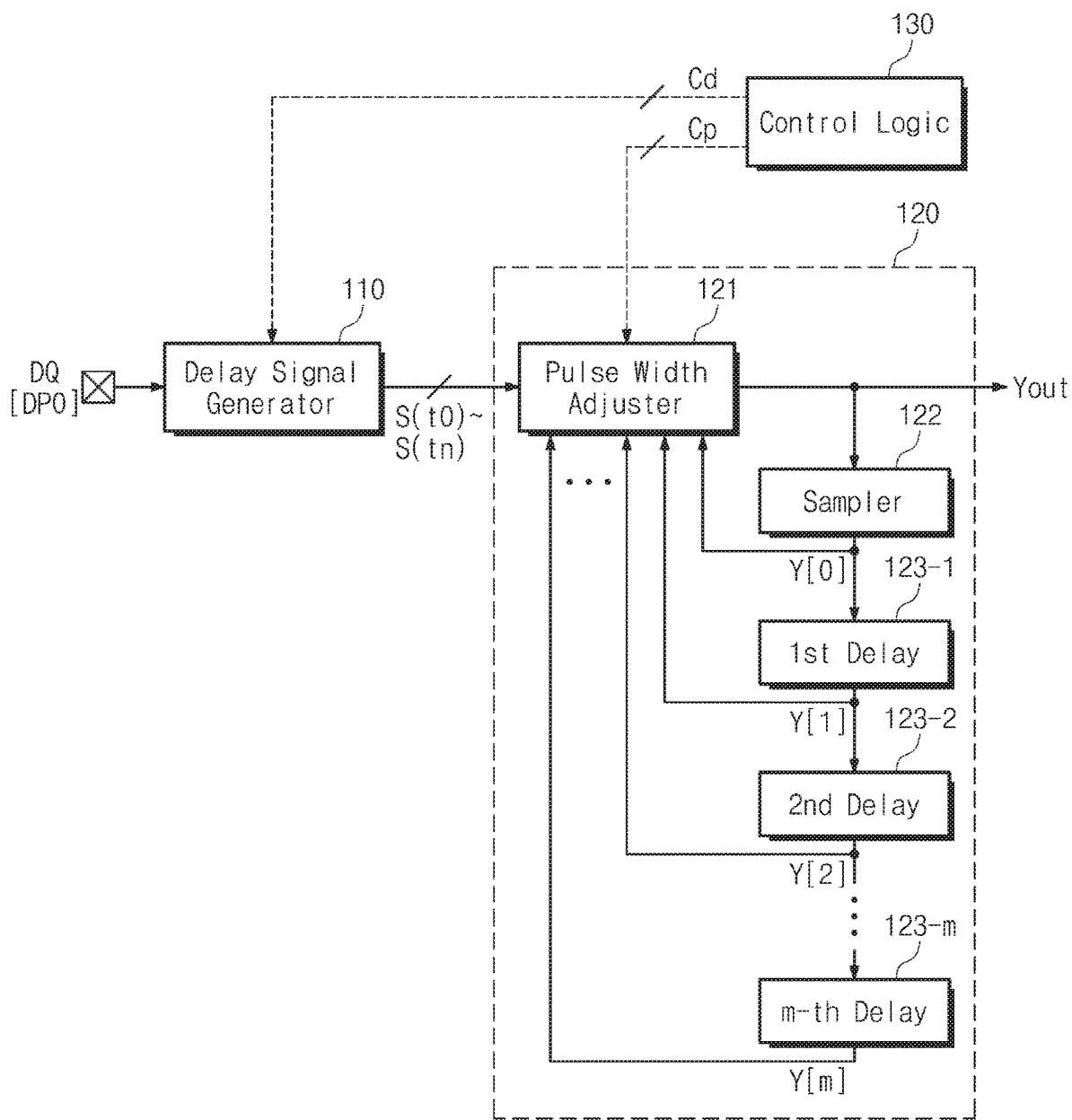
FIG. 6 is a block diagram illustrating a pulse width controlled decision feedback equalizer (PWC-DFE) of FIG. 5 in detail.

In an example embodiment, a pulse width control operation described with reference to FIGS. 2 to 4B may be performed through the plurality of delay signal generators 110-1 to 110-n and the plurality of PWC-DFEs 120-1 to 120-n. A configuration and an operation method will be more fully described with reference to the following drawings FIG. 6 is a block diagram illustrating a PWC-DFE of FIG. 5 in detail. Below, for convenience of description, an example embodiment of the inventive concepts will be described with reference to one data line DQ, one delay signal generator 110, and one PWC-DFE 120. However, the inventive concepts are not limited thereto. For example, a plurality of delay signal generators and a plurality of PWC-DFEs may operate based on example embodiments to be described below.

The pulse width controller 100 may include the delay signal generator 110, the PWC-DFE 120, and the control logic 130. The delay signal generator 110 may receive a data pattern DP0 through the data line DQ, and may output a plurality of delay signals S(t0) to S(tn) by delaying a data signal according to the received data pattern DP0. In an example embodiment, each of the plurality of delay signals S(t0) to S(tn) may be a signal delayed based on a delay coefficient Cd from the control logic 130.

The PWC-DFE 120 may include a pulse width adjuster 121, a sampler 122, and a plurality of delays 123-1 to 123-m.

The sampler 122 may be configured to sample the final output signal Yout from the pulse width adjuster 121. A 0-th feedback signal Y[0] sampled by the sampler 122 may be provided to the first delay 123-1. The first to m-th delays 123-1 to 123-m may be serially connected to each other, and may delay outputs of previous stages to output first to m-th feedback signals Y[1] to Y[m]. The 0-th to m-th feedback signals Y[0] to Y[m] may be fed back to the pulse width adjuster 121 from the sampler 122 and the first to m-th delays 123-1 to 123-m.

The pulse width adjuster 121 may output the final output signal Yout based on the 0-th to m-th feedback signals Y[0] to Y[m]. For example, the pulse width adjuster 121 may perform the above-described pulse width adjustment operation based on the 0-th to m-th feedback signals Y[0] to Y[m], adjustment coefficients Cp, and the plurality of delay signals S(t0) to S(tn) from the delay signal generator 110. The final output signal Yout may indicate a data signal, the pulse width of which is adjusted as described above.

For example, the 0-th feedback signal Y[0] may be a signal corresponding to the current data bit D[n], the first feedback signal Y[1] may be a signal corresponding to the first previous data bit D[n−1], and the second feedback signal Y[2] may be a signal corresponding to the second previous data bit D[n−2]. The pulse width adjuster 121 may adjust a pulse width, as described above, based on the 0-th to m-th feedback signals Y[0] to Y[m]. In this case, the pulse width adjuster 121 may adjust a pulse width of the final output signal Yout by combining (or adding) the plurality of delay signals S(t0) to S(tn) by using the adjustment coefficients Cp. A structure of the pulse width adjuster 121 will be more fully described with reference to FIG. 7.

In an example embodiment, values and the numbers of the delay coefficient Cd and the adjustment coefficients Cp may be variously changed or modified depending on the way to implement the pulse width adjuster 121. Also, the number of delays in the PWC-DFE 120 may be variously changed or modified depending on the way to implement the PWC-DFE 120. For example, in the case where the PWC-DFE 120 is implemented with a 1-TAP structure, the PWC-DFE 120 may include only the first delay 123-1; in the case where the PWC-DFE 120 is implemented with a 2-TAP structure, the PWC-DFE 120 may include only the first and second delays 123-1 and 123-2. In the case where the PWC-DFE 120 is implemented with an m-TAP structure, the PWC-DFE 120 may include the first to m-th delays 123-1 to 123-m.

Figure 7:
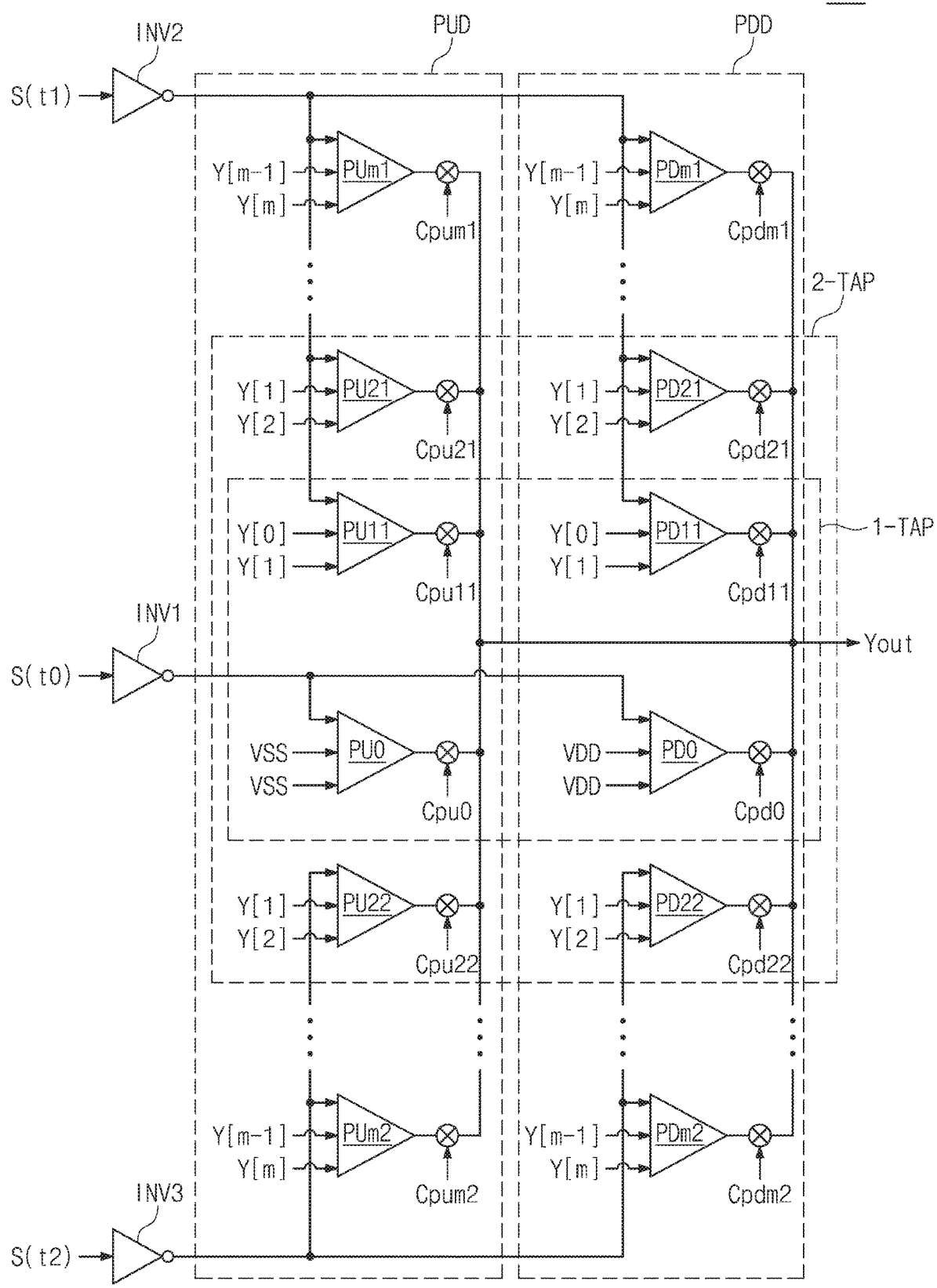
FIG. 7 is a circuit diagram illustrating a pulse width adjuster of FIG. 6.
Figure 8:
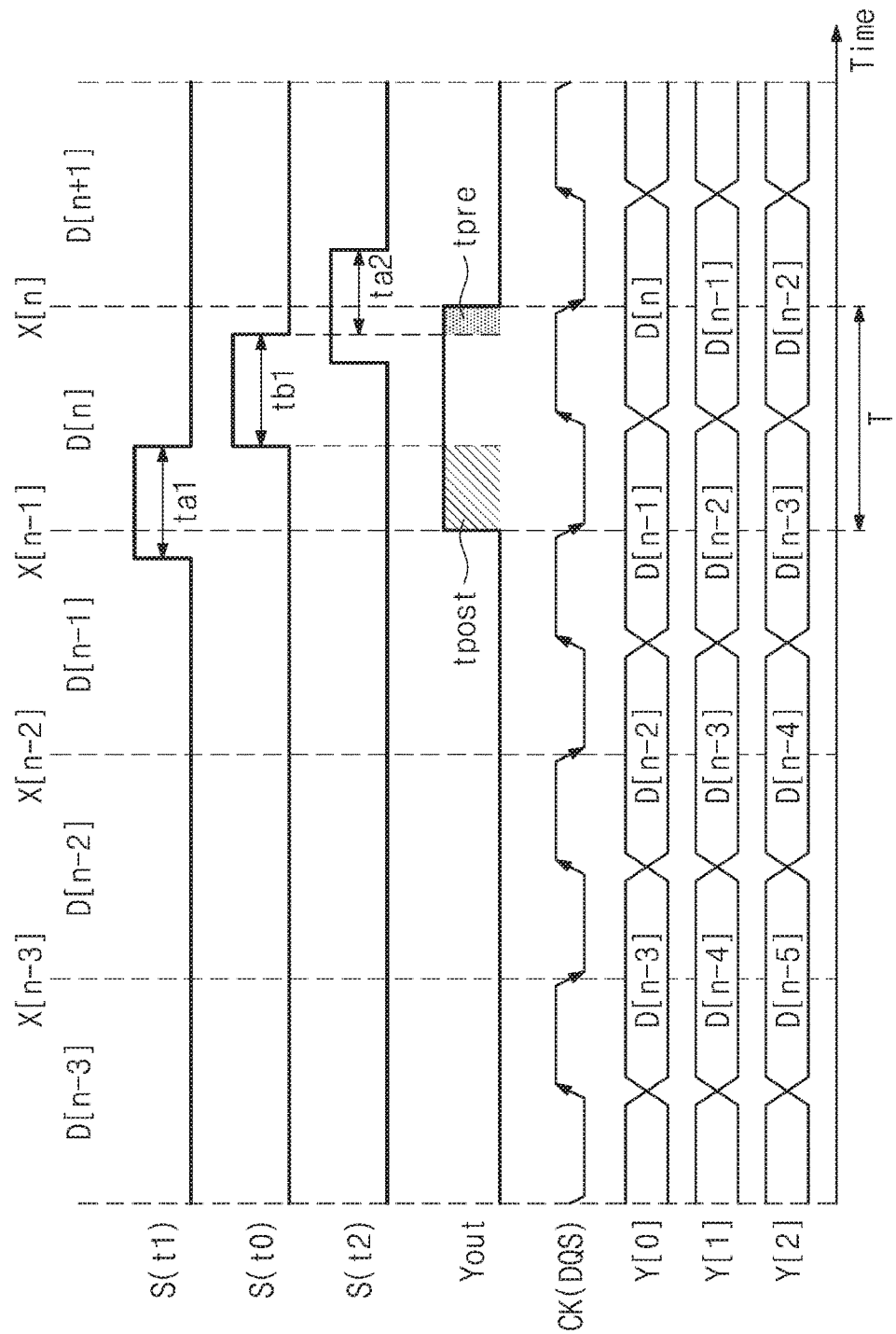
FIG. 8 is a timing diagram for describing an operation of a pulse width adjuster of FIG. 7.

FIG. 7 is a circuit diagram illustrating the pulse width adjuster 121 of FIG. 6. FIG. 8 is a timing diagram for describing an operation of the pulse width adjuster 121 of FIG. 7. For a brief description, it is assumed that the delay signal generator 110 outputs three delay signals S(t0), S(t1), and S(t2). Also, the circuit diagram of the pulse width adjuster 121 illustrated in FIG. 7 is provided as an example, and example embodiments of the inventive concepts are not limited thereto. The pulse width adjuster 121 may further include any other components such as an output buffer circuit.

Also, an example embodiment of FIG. 8 will be described with reference to a specific data pattern DP0 of "00010". That is, in FIG. 8, with regard to data bits D[n−3], D[n−2], D[n−1], D[n], and D[n+1] of the specific data pattern DP0, it is assumed that D[n−3] is "0", D[n−2] is "0", D[n−1] is "0", D[n] is "1", and D[n+1] is "0".

Also, even though the pulse width adjuster 121 having the m-TAP structure is illustrated in FIG. 7, for convenience of description, an operation of the pulse width adjuster 121 will be described with reference to the 2-TAP structure. However, the inventive concepts are not limited thereto. For example, as illustrated in FIG. 7, the pulse width adjuster 121 may be implemented with a 1-TAP or multi-TAP structure including a plurality of pull-up circuits PU and a plurality of pull-down circuits PD.

Referring to FIGS. 7 and 8, the pulse width adjuster 121 may include inverter circuits INV1 to INV3, a pull-up driver PUD, and a pull-down driver PDD. The inverter circuits INV1 to INV3 may be configured to receive the 0-th to second delay signals S(t0), S(t1), and S(t2) and invert the 0-th to second delay signals S(t0), S(t1), and S(t2) to output them, respectively.

In an example embodiment, the 0-th delay signal S(t0) may be a signal only including a delay by the data line DQ or an internal circuit, without a separate intentional delay. In the specific data pattern DP0, the 0-th delay signal S(t0) may be a signal having a high level in a portion (e.g., tb1) of the "D[n]" duration as illustrated in FIG. 8. As illustrated in FIG. 8, the first delay signal S(t1) may be a signal, the phase of which is advanced by a first time ta1 with respect to the 0-th delay signal S(t0). As illustrated in FIG. 8, the second delay signal S(t2) may be a signal, the phase of which is delayed by a second time ta2 with respect to the 0-th delay signal S(t0).

In an example embodiment, each of the 0-th, first, and second delay signals S(t0), S(t1), and S(t2) may be a signal which is generated by the delay signal generator 110-1 based on the delay coefficient Cd. Phases of the first and second delay signals S(t1) and S(t2) may be determined by the delay coefficient Cd of the control logic 130. In an example embodiment, in the case where the delay signal generator 110 generates three delay signals S(t0), S(t1), and S(t2), phase differences between the delay signals S(t0), S(t1), and S(t2) may be determined to satisfy the following Equation 1.

$$ta1+tb1+ta2>T$$
$$ta1 \leq tb1$$
$$ta2 \leq tb1 \quad \text{[Equation 1]}$$

Referring to Equation 1, ta1 represents a delay time of the first delay signal S(t1), ta2 represents a delay time of the second delay signal S(t2), tb1 represents a length of a high duration of the 0-th delay signal S(t0), and "T" represents one period of a data signal. As described above, the control logic 130 may generate the delay coefficients Cd to satisfy Equation 1.

As illustrated in FIG. 7, the pull-up driver PUD and the pull-down driver PDD may output the final output signal Yout based on signals from the inverter circuits INV1 to INV3 and the 0-th to m-th feedback signals Y[0] to Y[m].

For example, the pull-up driver PUD may increase a voltage of an output node connected with the final output signal Yout based on the signals from the inverter circuits INV1 to INV3 and the 0-th to m-th feedback signals Y[0] to Y[m]. That is, a pulse width of a high duration may be increased by an operation of the pull-up driver PUD.

The pull-down driver PDD may decrease a voltage of the output node connected with the final output signal Yout based on the signals from the inverter circuits INTV1 to INV3 and the 0-th to m-th feedback signals Y[0] to Y[m]. That is, a pulse width of a low duration may be increased by an operation of the pull-down driver PDD.

In detail, the pull-up driver PUD may include a plurality of pull-up circuits PU0 to PUm2, and the pull-down driver PDD may include a plurality of pull-down circuits PD0 to PDm2. Each of the plurality of pull-up circuits PU0 to PUm2 may output a signal of a high level when all input signals are "0". Each of the plurality of pull-down circuits PD0 to PDm2 may output a signal of a low level when all input signals are "1".

For example, as illustrated in FIG. 8, the 0-th, first, and second feedback signals Y[0], Y[1], and Y[2] may be D[n−1], D[n−2], and D[n−3] at a point X[n−1]. That is, at the point X[n−1], the 0-th, first, and second feedback signals Y[0], Y[1], and Y[2] may have a value of "0". In this case, referring to a pull-up driver of the 2-TAP structure, before the point X[n−1], since all inputs of the pull-up circuits PU11 and PU21 are "0", the pull-up circuits PU11 and PU21 may output high-level signals, respectively. That is, at the point X[n−1], the final output signal Yout may be set to the high level by the pull-up driver PUD. In other words, in a first duration tpost, the high level of the final output signal Yout may be generated by the pull-up driver PUD. This may mean that a high duration is increased by the first duration tpost by the pull-up driver PUD because data bits of the non-transition state have a value of "0".

In an example embodiment, the 0-th, first, and second feedback signals Y[0], Y[1], and Y[2] may be changed in synchronization with a clock signal CK. In an example embodiment, the clock signal CK may be the data strobe signal DQS.

Afterwards, until the point X[n], the final output signal Yout may maintain the high level by the pull-up driver PUD. For example, at the point X[n], the 0-th, first, and second feedback signals Y[0], Y[1], and Y[2] may be D[n], D[n−1], and D[n−2]. That is, at the point X[n], the 0-th, first, and second feedback signals Y[0], Y[1], and Y[2] may have values of "1", "0", and "0", respectively. In this case, at the point X[n], since all inputs (Y[1], Y[2], and an inverted version of a second delay signal) of the pull-up circuit PU22 are "0", the pull-up circuit PU22 may output a signal of the high level. That is, at the point X[n], a level of the final output signal Yout may be the high level. In other words, a high duration may be increased by a second duration tpre by the pull-up driver PUD because data bits of the non-transition state have a value of "0".

As a result, compared with the 0-th delay signal S(t0), the final output signal Yout may be compensated by the time tpost at the point X[n−1] and may be compensated by the time tpre at the point X[n]. This may mean that a pulse of the high level is added to the output signal Yout by the time tpost at the point X[n−1] and by the time tpre at the point X[n].

In an example embodiment, output signals of the plurality of pull-up circuits PU0 to PUm2 and the plurality of pull-down circuits PD0 to PDm2 may be provided to the output node associated with the final output signal Yout after being amplified by corresponding adjustment coefficients Cpu0 to Cpum2 and Cpd0 to Cpdm2. In an example embodiment, adjustment coefficients corresponding to the plurality of pull-up circuits PU0 to PUm2 and the plurality of pull-down circuits PD0 to PDm2 may be different from each other. In an example embodiment, the adjustment coefficients Cpu0 to Cpum2 and Cpd0 to Cpdm2 may be provided from the control logic 130, and may set through an initialization operation or may be in advance set through firmware of a manufacturer.

As described above, the pulse width controller 100 according to example embodiments of the inventive concepts may increase/decrease a pulse width of a high duration or a low duration at a current point based on values of previous data bits. As such, since an effective margin for identifying data is increased, a memory controller having improved reliability is provided.

Figure 9:
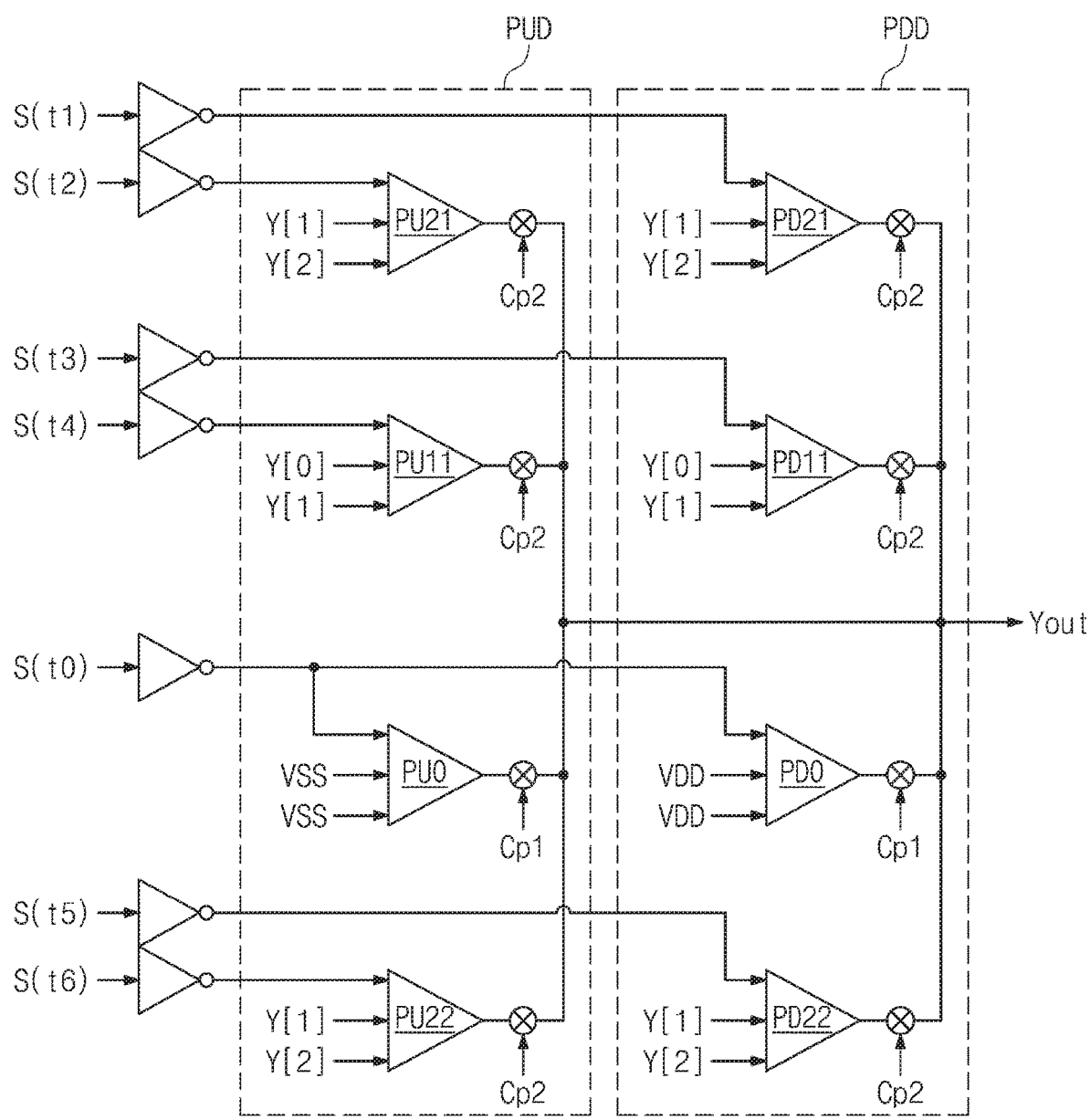
FIG. 9 is a block diagram illustrating a pulse width adjuster of FIG. 6.
Figure 10:
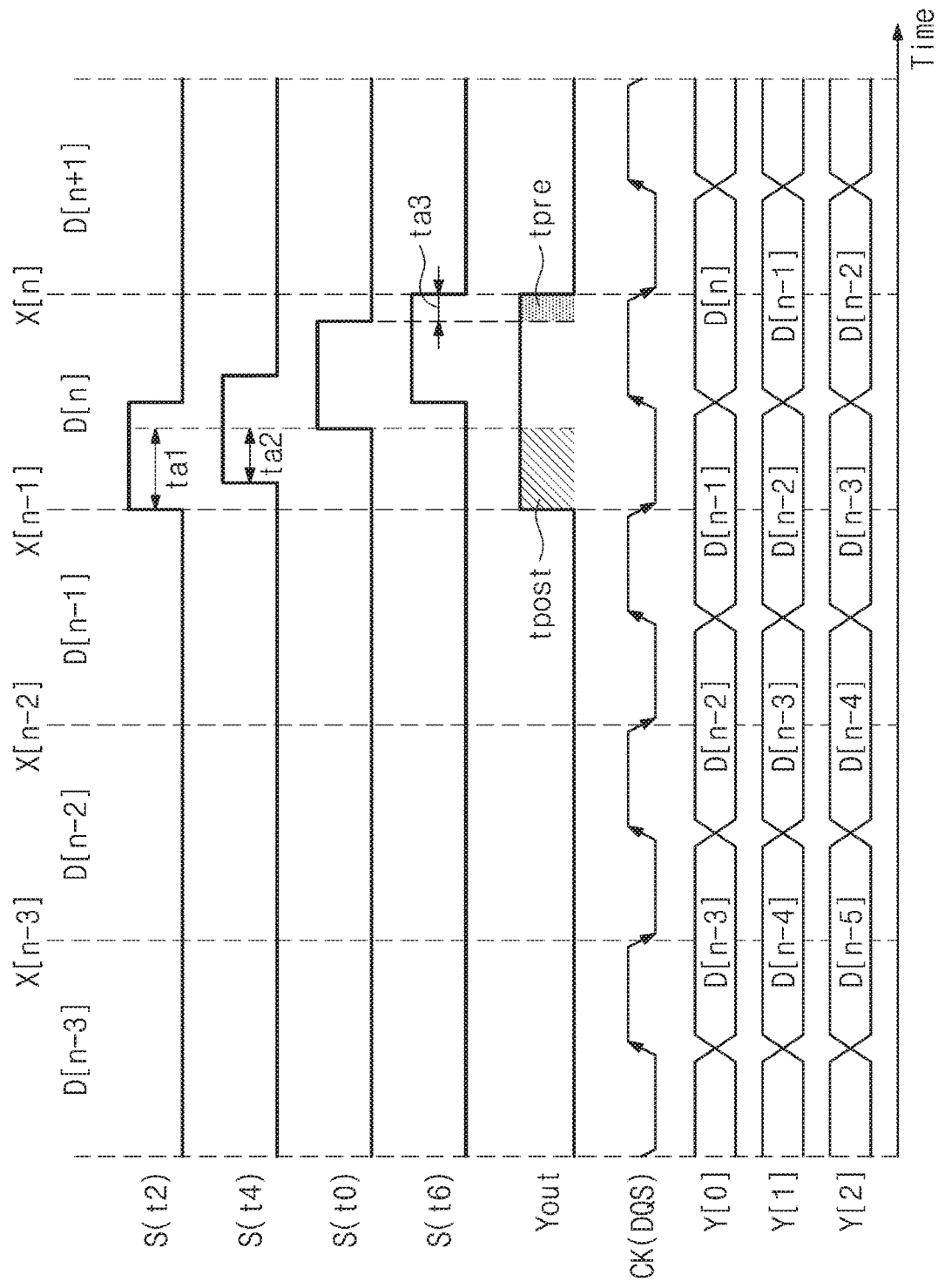
FIG. 10 is a timing diagram for describing an operation of a pulse width adjuster of FIG. 9.

FIG. 9 is a block diagram illustrating a pulse width adjuster of FIG. 6. FIG. 10 is a timing diagram for describing an operation of a pulse width adjuster of FIG. 9. For convenience of description, the description that is given with reference to the above-described components will not be repeated here. Also, for a brief description, as in the above description, embodiments of FIGS. 9 and 10 will be described with reference to the data pattern DP0 of "00010".

Referring to FIGS. 9 and 10, a pulse width adjuster 121' may include a plurality of inverter circuits, the pull-up driver PUD, and the pull-down driver PDD. Unlike the pulse width adjuster 121 of FIG. 7, the pulse width adjuster 121' of FIG. 9 may receive seven delay signals S(t0) to S(t6).

For example, the delay signal generator 110 may generate the plurality of delay signals S(t0) to S(t6) based on the delay coefficient Cd from the control logic 130. Each of the plurality of delay signals S(t0) to S(t6) may be a delay signal, the phase of which is advanced or delayed by a given time with respect to the 0-th delay signal S(t0). For example, as illustrated in FIG. 10, phases of the second and fourth delay signals S(t2) and S(t4) may be respectively advanced by first and second times ta1 and ta2 with respect to the 0-th delay signal S(t0). A phase of the sixth delay signal S(t6) may be delayed by a third time ta3 with respect to the 0-th delay signal S(t0). Although not illustrated in FIG. 10, a phase of each of the remaining delay signals may be advanced or delayed by a given time with respect to the 0-th delay signal S(t0). A phase of each delay signal may be set by the delay coefficient Cd from the control logic 130.

As in the above description, the pull-up driver PUD and the pull-down driver PDD may adjust a level of the final output signal Yout based on signals from the plurality of inverter circuits and the 0-th to second feedback signals Y[0] to Y[2]. For example, the pull-up driver PUD may include a plurality of pull-up circuits PU0 to PU22, and each of the plurality of pull-up circuits PU0 to PU22 may output a signal of the high level when all input signals are "0". The pull-down driver PDD may include a plurality of pull-down circuits PD0 to PD22, and each of the plurality of pull-down circuits PD0 to PD22 may output a signal of the low level when all input signals are "1". The operations of the pull-up driver PUD and the pull-down driver PDD are described above, and additional description will be omitted to avoid redundancy.

In an example embodiment, an output signal of the pull-up circuit PU0 in the pull-up driver PUD and an output signal of the pull-down circuit PD0 in the pull-down driver PDD may be amplified by a first adjustment coefficient Cp1, and output signals of the remaining pull-up circuits PU11 to PU22 in the pull-up driver PUD and output signals of the remaining pull-down circuits PD11 to PD22 in the pull-down driver PDD may be amplified by a second adjustment coefficient Cp2. In this case, the magnitude of the second adjustment coefficient Cp2 may be set to be significantly great compared with the first adjustment coefficient Cp1 (i.e., Cp2>>Cp1). This is to implement exact compensation by making the strength of pull-up and pull-down circuits, which operate in response to delay signals, great.

As illustrated in FIG. 10, the final output signal Yout may be compensated by the pull-up driver PUD during a first duration tpost at a point X[n−1] and during a second duration tpre at a point X[n]. In other words, the pull-up driver PUD may output a signal of the high level during the first duration tpost by using the second and fourth delay signals S(t2) and S(t4) and the 0-th to second feedback signals Y[0] to Y[2], and the pull-up driver PUD may output a signal of the high level during the second duration tpre by using the sixth delay signal S(t6) and the 0-th to second feedback signals Y[0] to Y[2]. That is, since the previous data bits D[n−1], D[n−2], and D[n−3] have the same value, that is, "0" at the point X[n−1] and the previous data bits D[n−1] and D[n−2] have the same value, that is, "0" (i.e., D[n−1], D[n−2], and D[n−3] have the same value, that is, "0"), a pulse width of a high duration is increased at each point.

Although not illustrated in FIGS. 9 and 10, as in the operation method described with reference to FIGS. 6 to 10, a pulse width adjustment operation may be performed on the remaining data patterns. For example, a configuration for adjusting a pulse width of a high duration (i.e., a duration corresponding to a data bit of "1") is described with reference to FIGS. 6 to 10. However, the configuration may be applied to adjust a pulse width of a low duration (i.e., a duration corresponding to a data bit of "0"). In this case, a level of the final output signal Yout may be adjusted by the pull-down driver PDD.

Figure 11:
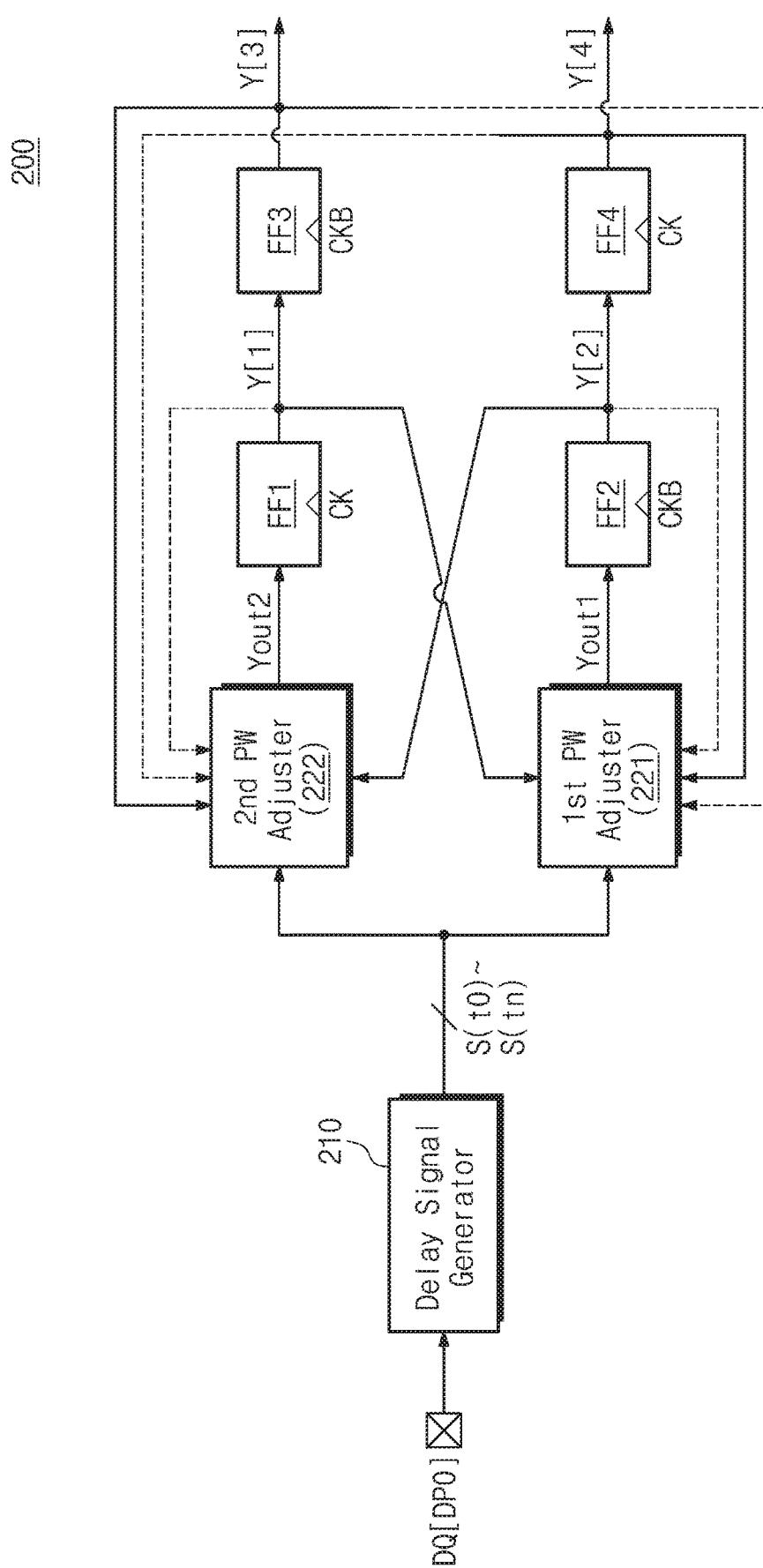
FIG. 11 is a block diagram illustrating a pulse width controller according to an example embodiment of the inventive concepts.

FIG. 11 is a block diagram illustrating a pulse width controller 200 according to an example embodiment of the inventive concepts.

In an example embodiment, the pulse width controller 100 described with reference to FIGS. 1A to 10 shows a data receiving stage of a full-rate structure (i.e., a single data rate (SDR) data receiving stage). In contrast, the pulse width controller 200 of FIG. 11 shows a data receiving stage of a half-rate structure (i.e., a double data rate (DDR) data receiving stage). That is, the pulse width controller 100 described with reference to FIGS. 1A to 10 may receive or identify one data bit per period of the clock signal CK (or the data strobe signal DQS); in contrast, the pulse width controller 200 of FIG. 11 may receive or identify one data bit per half period of the clock signal CK (or the data strobe signal DQS).

Referring to FIG. 11, the pulse width controller 200 may include a delay signal generator 210, first and second pulse width adjusters 221 and 222, and first to fourth flip-flops FF1 to FF4. The first and second pulse width adjusters 221 and 222 and the first to fourth flip-flops FF1 to FF4 may constitute the above-described PWC-DFE.

The delay signal generator 210 may receive a specific data pattern DP0 through the data line DQ, and may output a plurality of delay signals S(t0) to S(tn) based on the received data pattern DP0. The delay signal generator 210 is described above, and thus, a detailed description thereof will not be repeated here.

The first flip-flop FF1 may receive a second final output signal Yout2 from the second pulse width adjuster 222 and may output a first feedback signal Y[1] in response to the clock signal CK. The second flip-flop FF2 may receive a first final output signal Yout1 from the first pulse width adjuster 221 and may output a second feedback signal Y[2] in response to the inverted clock signal CKB. The third flip-flop FF3 may receive the first feedback signal Y[1] from the first flip-flop FF1 and may output a third feedback signal Y[3] in response to an inverted clock signal CKB. The fourth flip-flop FF4 may receive the second feedback signal Y[2] from the second flip-flop FF2 and may output a fourth feedback signal Y[4] in response to the clock signal CK.

The first and second pulse width adjusters 221 and 222 may respectively output the first and second final output signals Yout1 and Yout2 based on the plurality of delay signals S(t0) to S(tn) from the delay signal generator 210 and the first to fourth feedback signals Y[1] to Y[4]. In an example embodiment, configurations of the first and second pulse width adjusters 221 and 222 may be similar to the configuration of pulse width adjusters described with reference to FIG. 7 or 9. In an example embodiment, the first and second pulse width adjusters 221 and 222 may be implemented with the 2-TAP structure.

That is, each of the first and second pulse width adjusters 221 and 222 may include the pull-up driver PUD and the pull-down driver PDD, and the pull-up driver PUD and the pull-down driver PDD in each of the first and second pulse width adjusters 221 and 222 may adjust levels of the first and second final output signals Yout1 and Yout2 based on input signals.

In an example embodiment, each of the first and second pulse width adjusters 221 and 222 may obtain a state (i.e., transition information) of a data bit before one period from a current time point based on the first and second feedback signals Y[1] and Y[2], and may obtain a state (i.e., transition information) of a data bit before two periods from the current time point based on the third and fourth feedback signals Y[3] and Y[4]. In an example embodiment, each of the first and second pulse width adjusters 221 and 222 may obtain a state (i.e., transition information) of a data bit before two periods by using first and second feedback signals delayed by a given time (e.g., a time corresponding to half the period).

Figure 12:
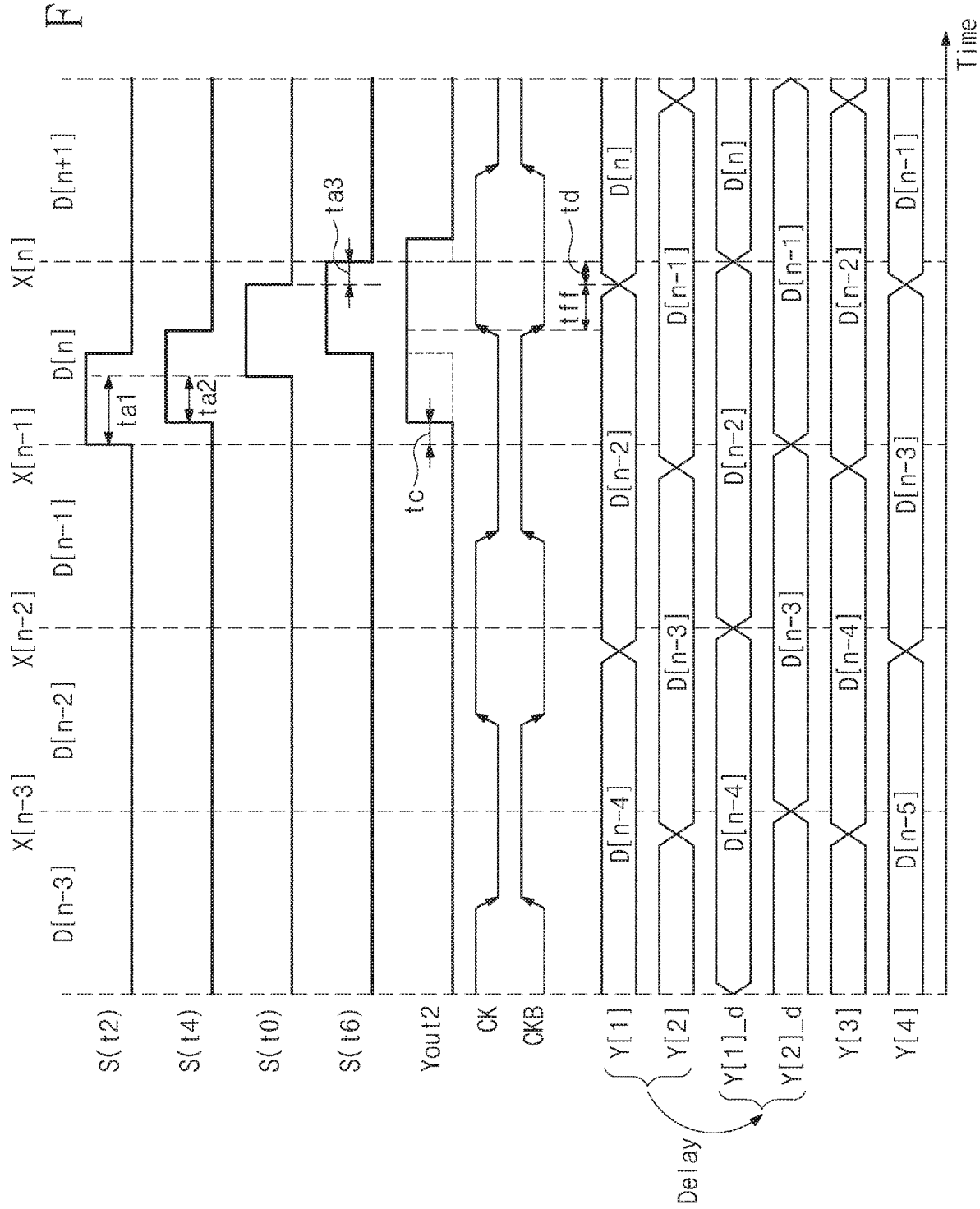
FIG. 12 is a timing diagram for describing an operation of a pulse width controller of FIG. 11.

FIG. 12 is a timing diagram for describing an operation of the pulse width controller 200 of FIG. 11. For brevity of illustration and convenience of description, a delay (e.g., a setup time of a flip-flop or the like) due to an actual operation in each circuit is not exactly applied to the timing diagram. However, the inventive concepts are not limited thereto. For example, some signals may include a delay due to an internal circuit configuration.

Also, for convenience of description, it is assumed that the second pulse width adjuster 222 is a pulse width adjuster operating based on the plurality of delay signals S(t0) to S(t6), as described with reference to FIG. 9. Also, an example embodiment of FIG. 12 will be described with reference to the second final output signal Yout2 of the second pulse width adjuster 222. However, the inventive concepts are not limited thereto.

Referring to FIGS. 11 and 12, the pulse width controller 200 may receive a data pattern of "00010". That is, D[n−3] may be "0", D[n−2] may be "0", D[n−1] may be "0", D[n] may be "1", and D[n+1] may be "0". As in the description given with reference to FIGS. 9 and 10, the pulse width controller 200 may receive the 0-th to sixth delay signals S(t0) to S(t6). The first, third, and fifth delay signals S(t1), S(t3), and S(t5) are unnecessary to describe an operation of the second pulse width adjuster 222, and a description thereof will be omitted. Also, the 0-th to sixth delay signals S(t0) to S(t6) are described with reference to FIGS. 9 and 10, and thus, additional description will be omitted to avoid redundancy.

At a point X[n−1], the first to fourth feedback signals Y[1] to Y[4] may be D[n−2], D[n−1], D[n−2], and D[n−3]. Also, at a point X[n], the first to fourth feedback signals Y[1] to Y[4] may be D[n], D[n−1], D[n−2], and D[n−1]. As in the above description, the second pulse width adjuster 222 may adjust a pulse width of the second final output signal Yout2 based on the first to fourth feedback signals Y[1] to Y[4] at the point X[n−1] and the point X[n].

In an example embodiment, the second final output signal Yout2 may be a signal delayed by a control delay time tc. The control delay time tc may be a delay time due to the second pulse width adjuster 222. In an example embodiment, the control delay time tc may be determined to satisfy Equation 2.

$$tff + tc \leq \frac{1}{2}T \qquad \text{[Equation 2]}$$

In Equation 2, tff represents a delay time due to a flip-flop, tc represents a delay time due to the second pulse width adjuster 222, and "T" represents one period of the second final output signal Yout2 or half the period of a clock signal.

In an example embodiment, at the point X[n−1], the pulse width controller 200 may use the first and second feedback signals Y[1] and Y[2] for the purpose of determining a state of a first previous data bit, and may use the third and fourth feedback signals Y[3] and Y[4] for the purpose of determining a state of a second previous data bit. For example, at the point X[n−1], the pulse width controller 200 may use the first and second feedback signals Y[1] and Y[2] being D[n−2] and D[n−1] for the purpose of determining a state of a first previous data bit D[n−1], and may use the third and fourth feedback signals Y[3] and Y[4] being D[n−2] and D[n−3] for the purpose of determining a state of a second previous data bit D[n−2]. In an example embodiment, each of the first to fourth feedback signals Y[1] to Y[4] may be a signal which is delayed by a given time tff with respect to the clock CK and the inverted clock signal CKB. The given time tff may be a delay time due to the flip-flops FF1 to FF4.

In an example embodiment, at the point X[n], first and second delayed feedback signals Y[1]_d and Y[2]_d which are obtained by delaying the first and second feedback signals Y[1] and Y[2] by a delay time td may be used to determine a state of the second previous data bit. For example, at the point X[n], the pulse width controller 200 may use the first and second delayed feedback signals Y[1]_d and Y[2]_d being D[n−2] and D[n−1] for the purpose of determining a state of a second previous data bit D[n−1]. The first and second delayed feedback signals Y[1]_d and Y[2]_d may include various signal delays such as a delay due to a separate delay circuit and a delay due to an internal interconnection.

As illustrated in FIG. 12, the second pulse width adjuster 222 may output the second final output signal Yout2 based on the first to fourth feedback signals Y[1] to Y[4] and the plurality of delay signals S(t0) to S(t6). As illustrated in FIG. 12, a high duration of the second final output signal Yout2 may be respectively increased or compensated at the point X[n−1] and the point X[n]. Since an operation of the second pulse width adjuster 222 is similar to an operation of a pulse width adjuster described with reference to FIGS. 9 and 10, additional description will be omitted to avoid redundancy.

Figure 13:
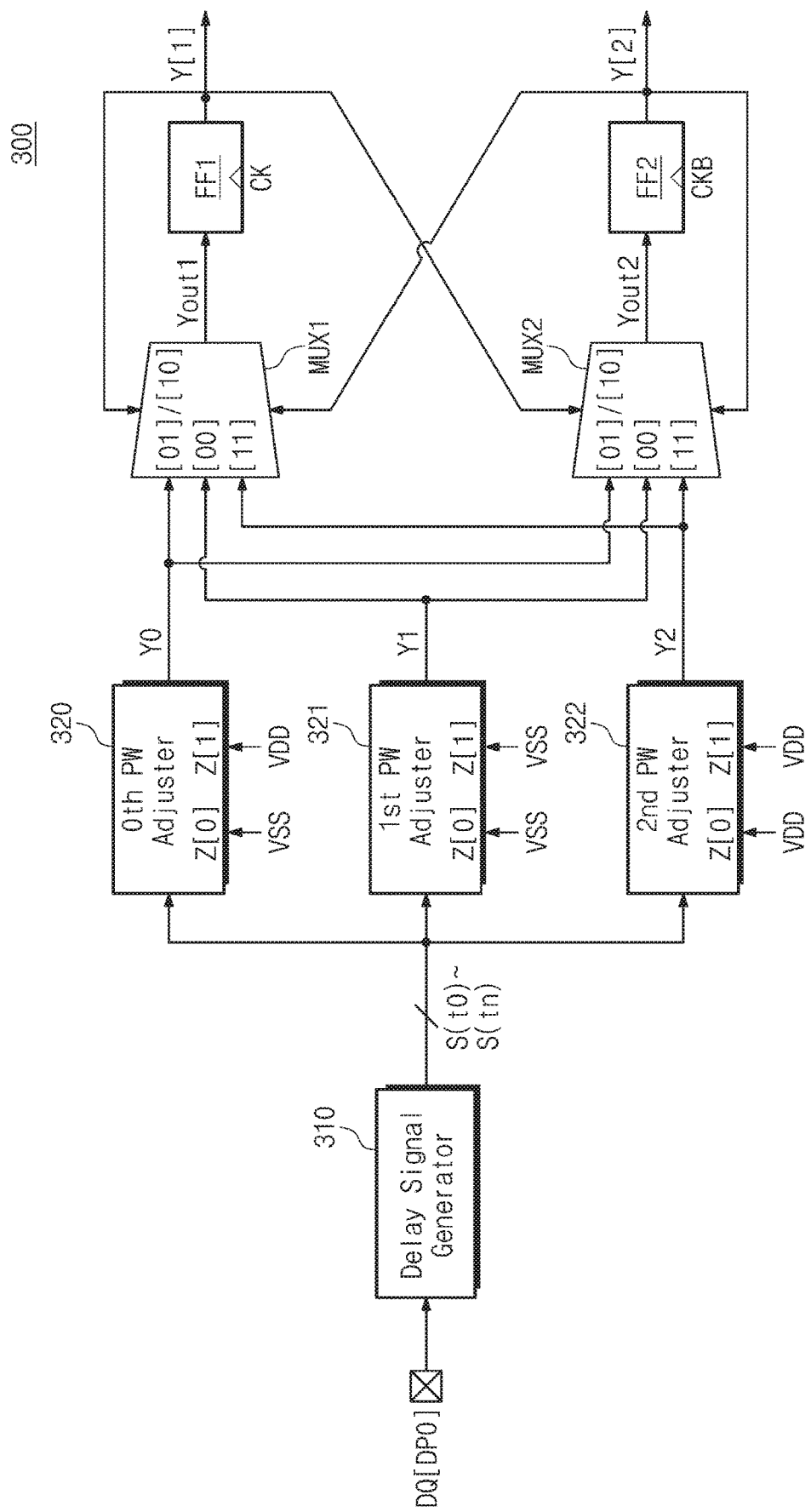
FIG. 13 is a block diagram illustrating a pulse width controller according to an example embodiment of the inventive concepts.
Figure 14:
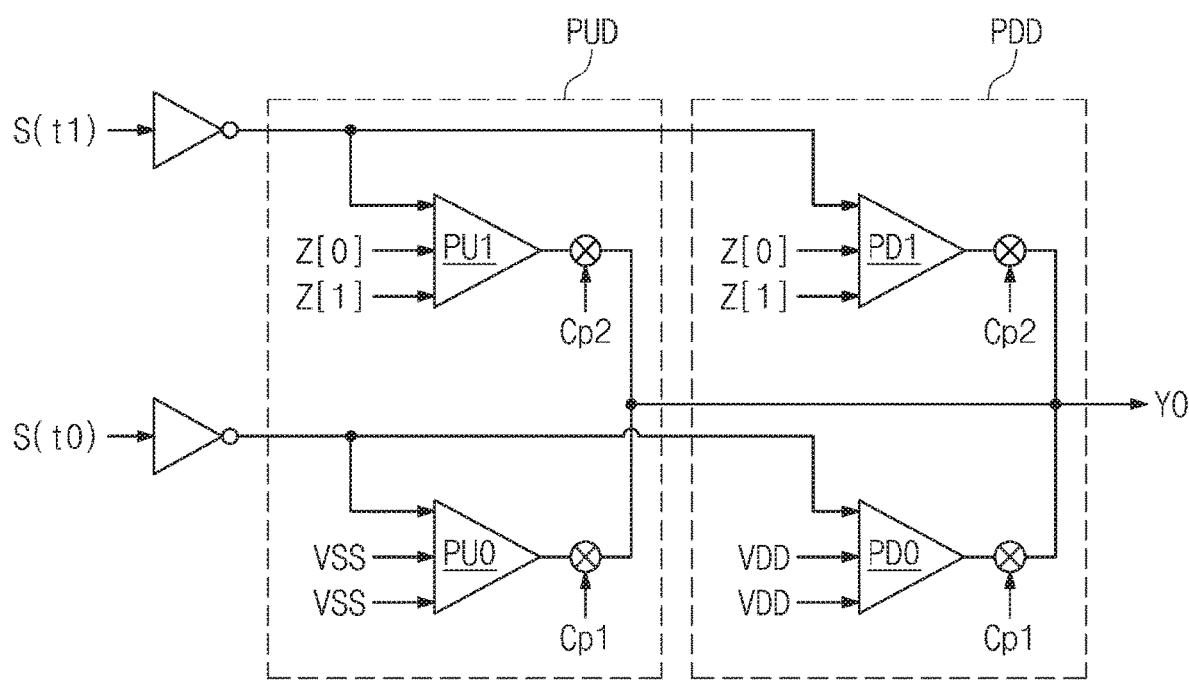
FIG. 14 is a block diagram illustrating a 0-th pulse width adjuster of FIG. 13.

FIG. 13 is a block diagram illustrating a pulse width controller 300 according to an example embodiment of the inventive concepts. FIG. 14 is a diagram illustrating a 0-th pulse width adjuster 320 of FIG. 13. For a brief description, a description associated with the above-described components will not be repeated here.

Referring to FIGS. 13 and 14, the pulse width controller 300 may include a delay signal generator 310, 0-th to second pulse width adjusters 320 to 322, first and second multiplexers MUX1 and MUX2, and first and second flip-flops FF1 to FF2.

The delay signal generator 310 may receive a specific data pattern DP0 from the data line DQ, and may output a plurality of delay signals S(t0) to S(tn). The delay signal generator 310 is described above, and thus, additional description will be omitted to avoid redundancy.

Each of the 0-th to second pulse width adjusters 320 to 322 may receive the plurality of delay signals S(t0) to S(tn), and the 0-th to second pulse width adjusters 320 to 322 may output 0-th to second intermediate signals Y0 to Y2 based on the received delay signals, respectively.

For example, as illustrated in FIG. 14, the 0-th pulse width adjuster 320 may include a pull-up driver PUD and a pull-down driver PDD. As described above, the pull-up driver PUD may include pull-up circuits PU, and each of the pull-up circuits PU may output a signal of the high level when all input signals are "0". The pull-down driver PDD may include a plurality of pull-down circuits PD, and each of the pull-down circuits PD may output a signal of the low level when all input signals are "1".

An output signal of the pull-up circuit PU0 in the pull-up driver PUD and an output signal of the pull-down circuit PD0 in the pull-down driver PDD may be amplified by a first adjustment coefficient Cp1, and an output signal of the pull-up circuit PU1 in the pull-up driver PUD and an output signal of the pull-down circuit PD11 in the pull-down driver PDD may be amplified by a second adjustment coefficient Cp2. The magnitude of the second adjustment coefficient Cp2 may be significantly great compared with the first adjustment coefficient Cp1. In an example embodiment, structures of the first and second pulse width adjusters 321 and 322 may be similar to the structure of the 0-th pulse width adjuster 320 of FIG. 14.

A ground voltage VSS and a power supply voltage VDD may be applied to 0-th and first input terminals Z[0] and Z[1] of the 0-th pulse width adjuster 320, the ground voltage VSS may be applied to 0-th and first input terminals Z[0] and Z[1] of the first pulse width adjuster 321, and the power supply voltage VDD may be applied to 0-th and first input terminals Z[0] and Z[1] of the second pulse width adjuster 322.

In this case, the 0-th intermediate signal Y0 of the 0-th pulse width adjuster 320 may be the same as an output signal in a data pattern having data bits of "01" or "10". The first intermediate signal Y1 of the first pulse width adjuster 321 may be the same as an output signal in a data pattern having previous data bits of "00". The second intermediate signal Y2 of the second pulse width adjuster 322 may be the same as an output signal in a data pattern having previous data bits of "11". Since an operation method of the 0-th to second pulse width adjusters 320 to 322 is similar to an operation method of a pulse width adjuster described with reference to FIGS. 1A to 12, additional description will be omitted to avoid redundancy.

The first flip-flop FF1 may receive the first final output signal Yout1 and may output the first feedback signal Y[1] in response to the clock signal CK. The second flip-flop FF2 may receive the second final output signal Yout2 and may output the second feedback signal Y[2] in response to the inverted clock signal CK.

The first multiplexer MUX1 may select one of the 0-th to second intermediate signals Y0 to Y2 based on the first and second feedback signals Y[1] and Y[2] to output the first final output signal Yout1; the second multiplexer MUX2 may select one of the 0-th to second intermediate signals Y0 to Y2 based on the first and second feedback signals Y[1] and Y[2] to output the second final output signal Yout2. For example, in the case where the first and second feedback signals Y[1] and Y[2] indicate data bits of "10" or "01", the first and second multiplexers MUX1 and MUX2 may select the 0-th intermediate signal Y0 of the 0-th to second intermediate signals Y0 to Y2; in the case where the first and second feedback signals Y[1] and Y[2] indicate data bits of "00", the first and second multiplexers MUX1 and MUX2 may select the first intermediate signal Y1 of the 0-th to second intermediate signals Y0 to Y2; in the case where the first and second feedback signals Y[1] and Y[2] indicate data bits of "11", the first and second multiplexers MUX1 and MUX2 may select the second intermediate signal Y2 of the 0-th to second intermediate signals Y0 to Y2.

As described above, the pulse width controller 300 may generate a plurality of intermediate signals, the pulse widths of which are adjusted, with respect to a specific data pattern, and may select any one of the plurality of intermediate signals based on values of previous data bits and may output the selected signal as a final output signal.

Figure 15:
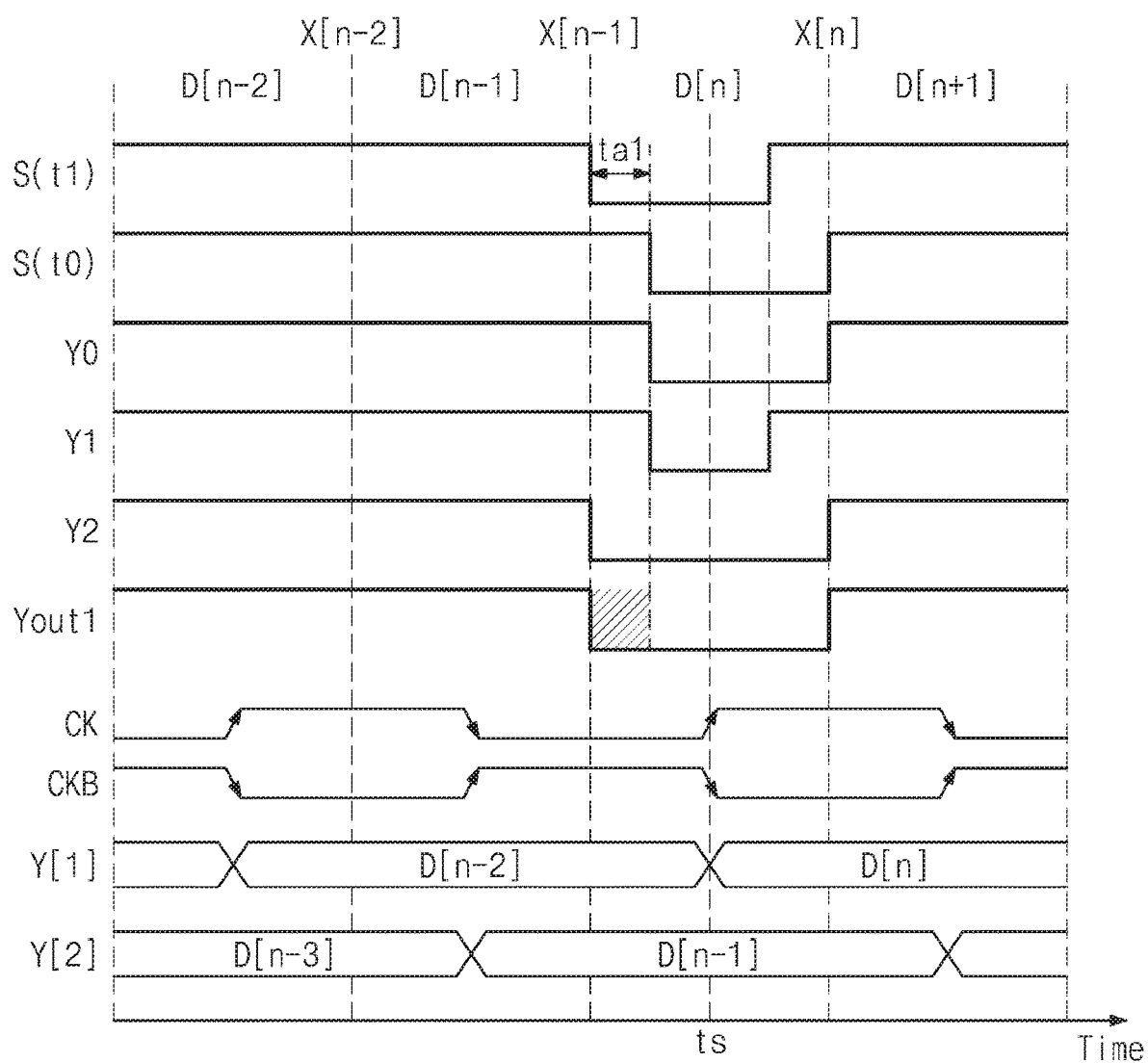
FIG. 15 is a timing diagram for describing an operation of a pulse width controller of FIG. 13.

FIG. 15 is a timing diagram for describing an operation of the pulse width controller 300 of FIG. 13. An example embodiment in which the first final output signal Yout1 is generated with regard to a data pattern of "1101" will be described with reference to FIG. 15. For a brief description, delay times due to components of the pulse width controller 300 are not illustrated in FIG. 15. However, the inventive concepts are not limited thereto.

Referring to FIGS. 13 and 15, the delay signal generator 310 may generate the 0-th and first delay signals S(t0) and S(t1). The 0-th delay signal S(t0) may have the low level in a partial duration of D[n], and a phase of the first delay signal S(t1) may be advanced by a first time ta1 with respect to the 0-th delay signal S(t0).

As described above, the 0-th intermediate signal Y0 may be identical to the 0-th delay signal S(t0). The reason is that a separate pulse width control is not applied to the 0-th intermediate signal Y0 associated with the case where previous data bits are "01" or "10". The first intermediate signal Y1 may have a data pulse, the low duration of which is reduced, as illustrated in FIG. 15. The reason is that a separate pulse width control is applied to the first intermediate signal Y1 associated with the case where previous data bits are "00". The second intermediate signal Y2 may include a data pulse having the low level in a duration of D[n], as illustrated in FIG. 15. The reason is that a separate pulse width control is applied to the second intermediate signal Y2 associated with the case where previous data bits are "11".

That is, at a point X[n−1], since previous data bits are "11", the second intermediate signal Y2 may be selected as the first final output signal Yout1. In an example embodiment, at a specific time point ts, the 0-th intermediate signal Y0 may be selected as the first final output signal Yout1. For example, at the specific time point ts, the first feedback signal Y[1] may be changed from D[n−2] to D[n]. In this case, the first and second feedback signals Y[1] and Y[2] input to the first multiplexer MUX1 may be changed from D[n−2]/D[n−1] to D[n]/D[n−1].

In an example embodiment, at the specific time point ts, a signal output from the first multiplexer MUX1 may be changed to the 0-th intermediate signal Y0, but the first final output signal Yout1 may be normally output. In other words, since previous data bits are "10" or "01" with respect to a point X[n], separate pulse width compensation may not be required. As such, the pulse width controller 300 of the inventive concepts may normally output a final output signal even though a feedback signal is changed in a specific data duration.

Figure 16A:
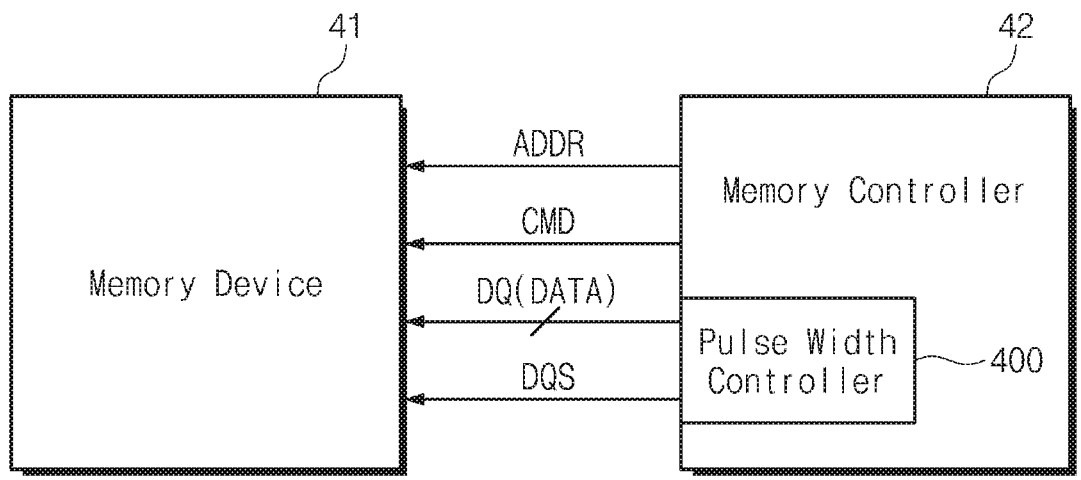
FIGS. 16A and 16B are block diagrams illustrating a memory system according to an example embodiment of the inventive concepts.
Figure 16B:
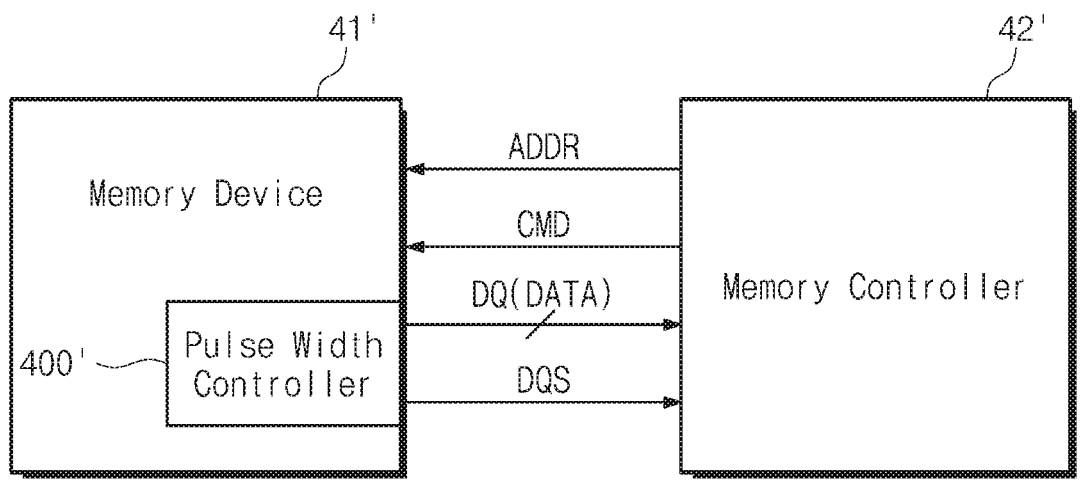

FIGS. 16A and 16B are block diagrams illustrating a memory system according to an example embodiment of the inventive concepts. Referring to FIG. 16A, a memory system 40 may include a memory device 41 and a memory controller 42. The memory controller 42 may transmit a command CMD and an address ADDR to the memory device 41. The memory controller 42 may transmit data "DATA" to the memory device 41 through the data line DQ and the data strobe line DQS.

In an example embodiment, the memory controller 42 may include a pulse width controller 400. For example, the pulse width controllers 100, 200, and 300 of FIGS. 1A to 15 are configured to control a pulse width of a received data signal at an input stage of a memory controller. In contrast, the pulse width controller 400 of FIG. 16 may in advance adjust a pulse width of a data signal at an output stage of the memory controller 42 and may transmit the data signal of the adjusted pulse width to the memory device 41. In the case where a data signal cannot fully swing normally depending on a load of the data line DQ, an effective margin may be secured by in advance adjusting a pulse width to transmit a data signal.

Referring to FIG. 16B, a memory system 40' may include a memory device 41' and a memory controller 42'. The memory controller 41' and the memory device 42' are described above, and thus, additional description will be omitted to avoid redundancy.

In an example embodiment, the memory device 42' may include a pulse width controller 400'. The pulse width controller 400' may in advance adjust a pulse width of a data signal and may transmit the data signal of the adjusted pulse width to the memory controller 42' through the data line DQ.

That is, as illustrated in FIGS. 16A and 16B, the memory device 41' or the memory controller 42 may be configured to in advance adjust a pulse width of a data signal and to transmit the data signal having the adjusted pulse width.

Figure 17:
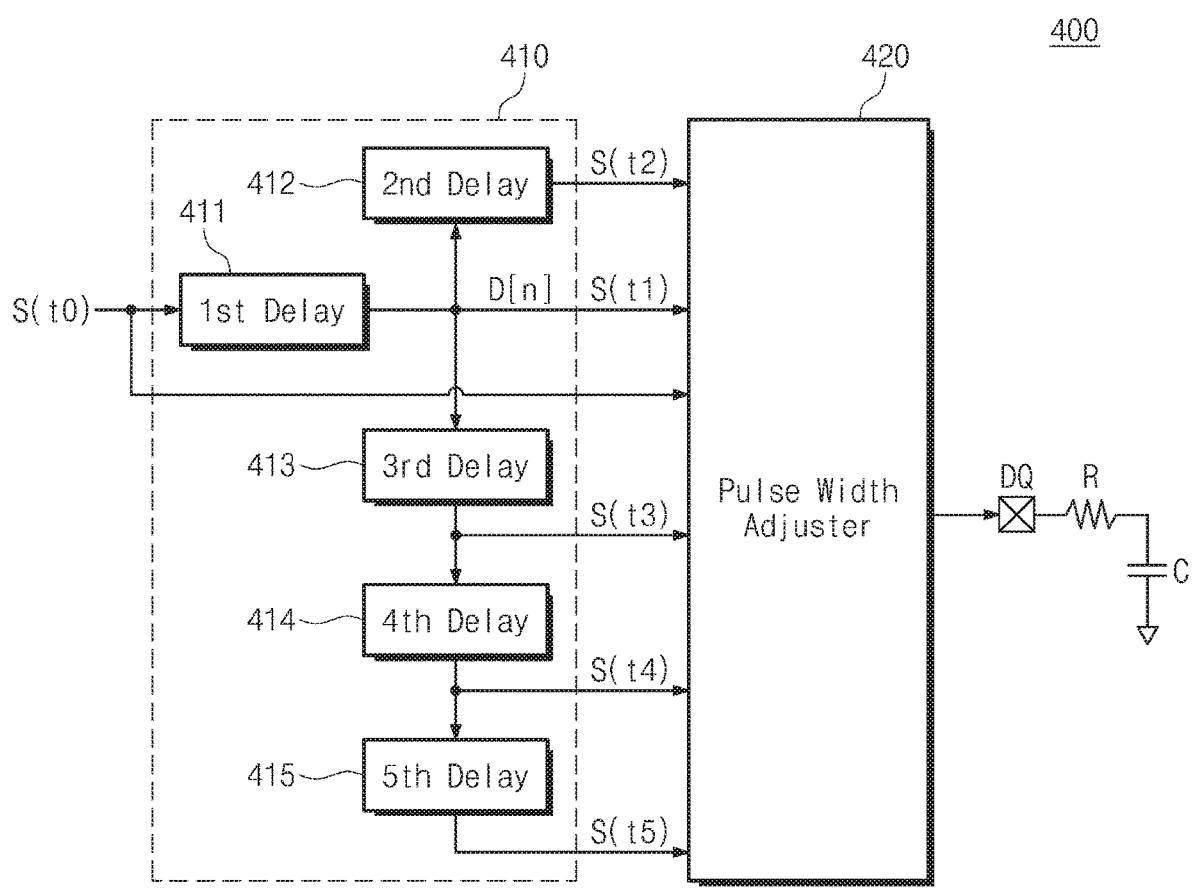
FIG. 17 is a block diagram illustrating a pulse width controller of FIG. 16.
Figure 18:
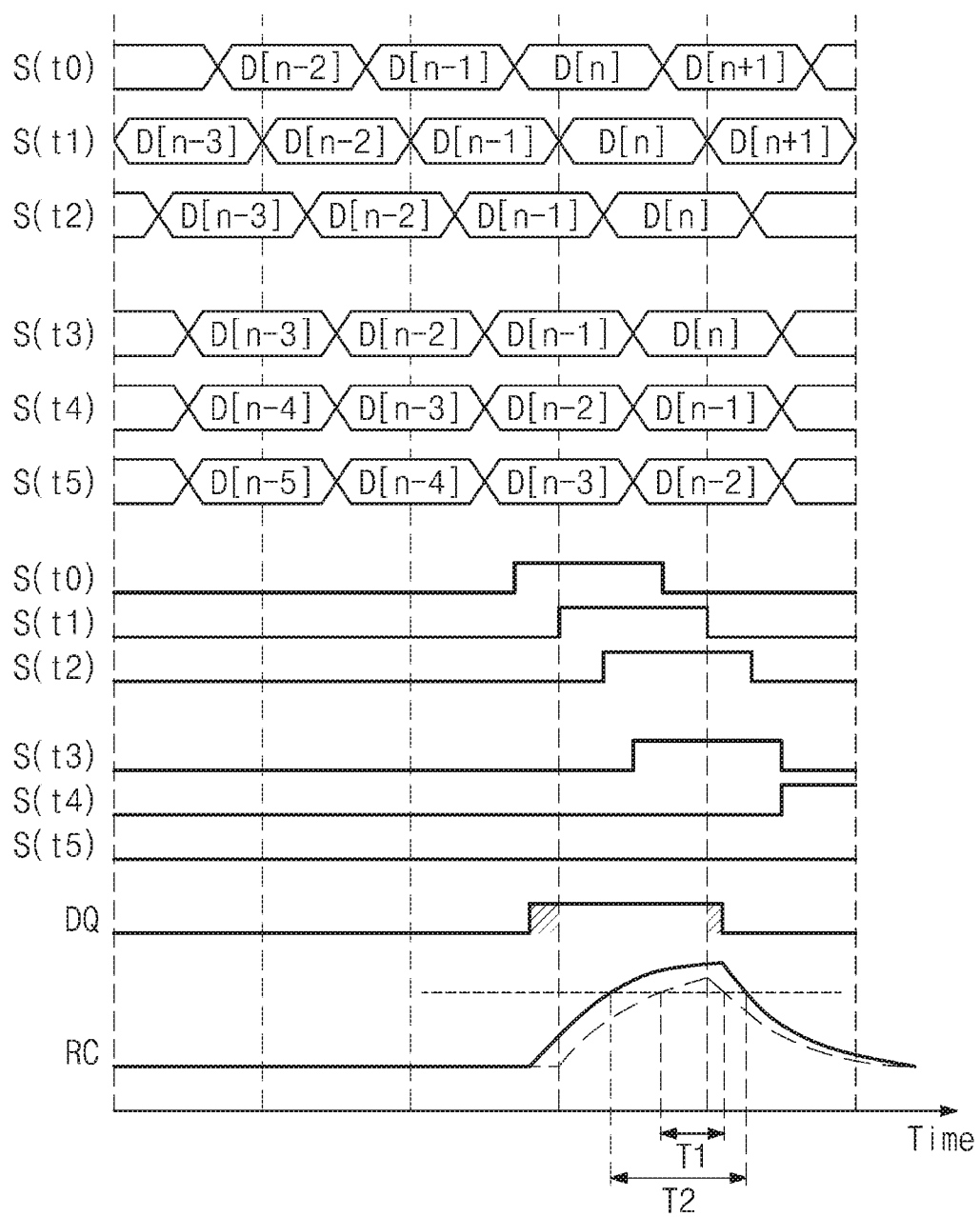
FIG. 18 is a timing diagram for describing an operation of a pulse width adjuster.

FIG. 17 is a block diagram illustrating a pulse width controller 400 of FIG. 16. FIG. 18 is a timing diagram for describing an operation of the pulse width controller 400. For a brief description, an example embodiment will be described with reference to the pulse width controller 400, but the inventive concepts are not limited thereto. Referring to FIGS. 17 and 18, the pulse width controller 400 may include a delay signal generator 410 and a pulse width adjuster 420.

The delay signal generator 410 may output a plurality of delay signals S(t1) to S(t5) based on an input data signal S(t0). For example, the delay signal generator 410 may include first to fifth delays 411 to 415. Each of the first to fifth delays 411 to 415 may delay and output an input signal by a given time.

The first delay 411 may delay the input signal S(t0) by a first time and may output a first delay signal S(t1). In an example embodiment, the first delay signal S(t1) may correspond to input data D[n]. The second delay 412 may delay the first delay signal S(t1) by a second time and may output a second delay signal S(t2). That is, timings of the input signal S(t0) and the first and second delay signals S(t1) and S(t2) may be illustrated in FIG. 18.

The third delay 413 may delay the first delay signal S(t1) corresponding to the input data D[n] by half the period time and may output a third delay signal S(t3). The fourth delay 414 may delay the third delay signal S(t3) by one period and may output a fourth delay signal S(t4). The fifth delay 415 may delay the fourth delay signal S(t4) by one period and may output a fifth delay signal S(t5). That is, timings of the third to fifth delay signals S(t3) to S(t5) may be illustrated in FIG. 18.

That is, in the case where input data have a data pattern of "00010", the input signal S(t0) and the first to fifth delay signals S(t1) to S(t5) may have waveforms illustrated in FIG. 18.

The pulse width adjuster 420 may receive the input signal S(t0) and the first to fifth delay signals S(t1) to S(t5) and may adjust a pulse width of a signal on the data line DQ based on the received signals. For example, in the case where input data have a data pattern of "00010", the pulse width adjuster 420 may adjust a pulse width in a duration corresponding to a data bit of "1", such that a signal of the data line DQ has a high duration longer than one period.

As such, a signal margin according to an RC load of the data line DQ may be secured. For example, in the case where a pulse width is not adjusted, a signal according to the RC load may have a waveform illustrated by a dotted line of FIG. 18. In this case, the effective margin may be a first time T1. In contrast, in the case where a pulse width is adjusted by the pulse width controller 400 according to an example embodiment of the inventive concepts, a signal according to the RC load may have a waveform illustrated by a solid line of FIG. 18; in this case, the effective margin may be a second time T2 longer than the first time T1. That is, a signal margin may be secured by adjusting a pulse width corresponding to a data bit to be currently provided based on a data bit previously transmitted to a memory device.

Figure 19A:
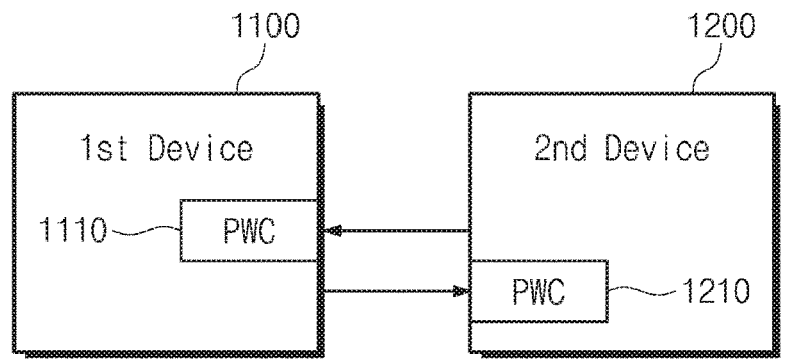
FIGS. 19A to 19C are block diagrams illustrating electronic devices including a pulse width controller according to the inventive concepts.
Figure 19B:
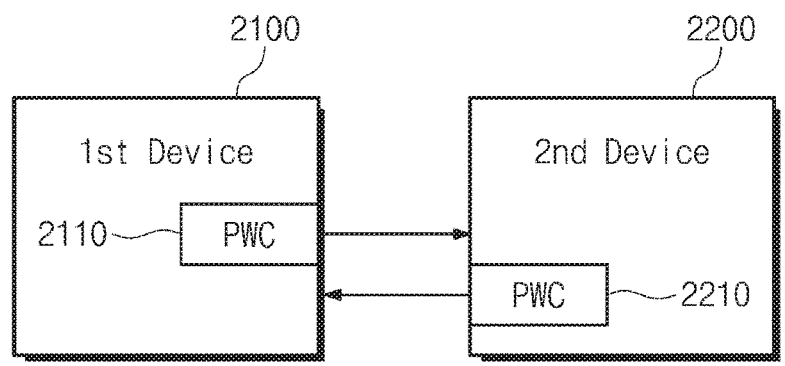
Figure 19C:
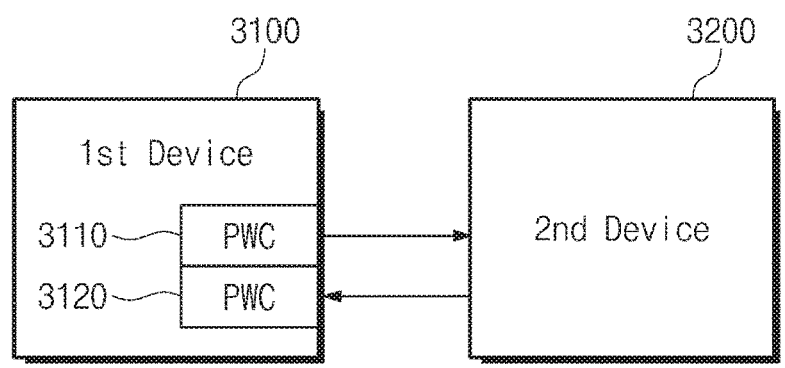

FIGS. 19A to 19C are block diagrams illustrating electronic devices including a pulse width controller PWC according to the inventive concepts. For a brief description, a description which is given with reference to the above components will not be repeated here.

Referring to FIG. 19A, a system 1000 may include first and second devices 1100 and 1200. The first and second devices 1100 and 1200 may be devices which exchange information signals, such as a data signal, an electrical signal, an analog signal, or a digital signal, in the system 1000. In an example embodiment, each of the first and second devices 1100 and 1200 may be an information processing device such as a signal transmitter, a signal receiver, an intellectual property (IP) block, an electronic module, or an electronic circuit.

The first and second devices 1100 and 1200 may include pulse width controllers 1110 and 1210, respectively. Each of the pulse width controllers 1110 and 1210 may be a pulse width controller described with reference to FIGS. 1A to 15. That is, the pulse width controllers 1110/1210 may be configured to adjust a pulse width of a signal received from the device 1200/1100.

Referring to FIG. 19B, a system 2000 may include first and second devices 2100 and 2200, and the first and second devices 2100 and 2200 may include pulse width controllers 2110 and 2210, respectively. Each of the pulse width controllers 2110 and 2210 may be a pulse width controller described with reference to FIGS. 16A to 18. That is, each of the first and second devices 2100 and 2200 may be configured to adjust a pulse width of a signal in advance and to transmit the signal having the adjusted pulse width.

Referring to FIG. 19C, a system 3000 may include first and second devices 3100 and 3200, and the first device 3100 may include first and second pulse width controllers 3110 and 3120. The first pulse width controller 3110 may be a pulse width controller described with reference to FIGS. 16A to 18, and the second pulse width controller 3120 may be a pulse width controller described with reference to FIGS. 1A to 15. That is, the first device 3100 may be configured to adjust a pulse width of a signal in advance and to transmit the signal having the adjusted pulse width, or may be configured to adjust a pulse width at a current point based on previous bit values of a received signal.

Figure 20:
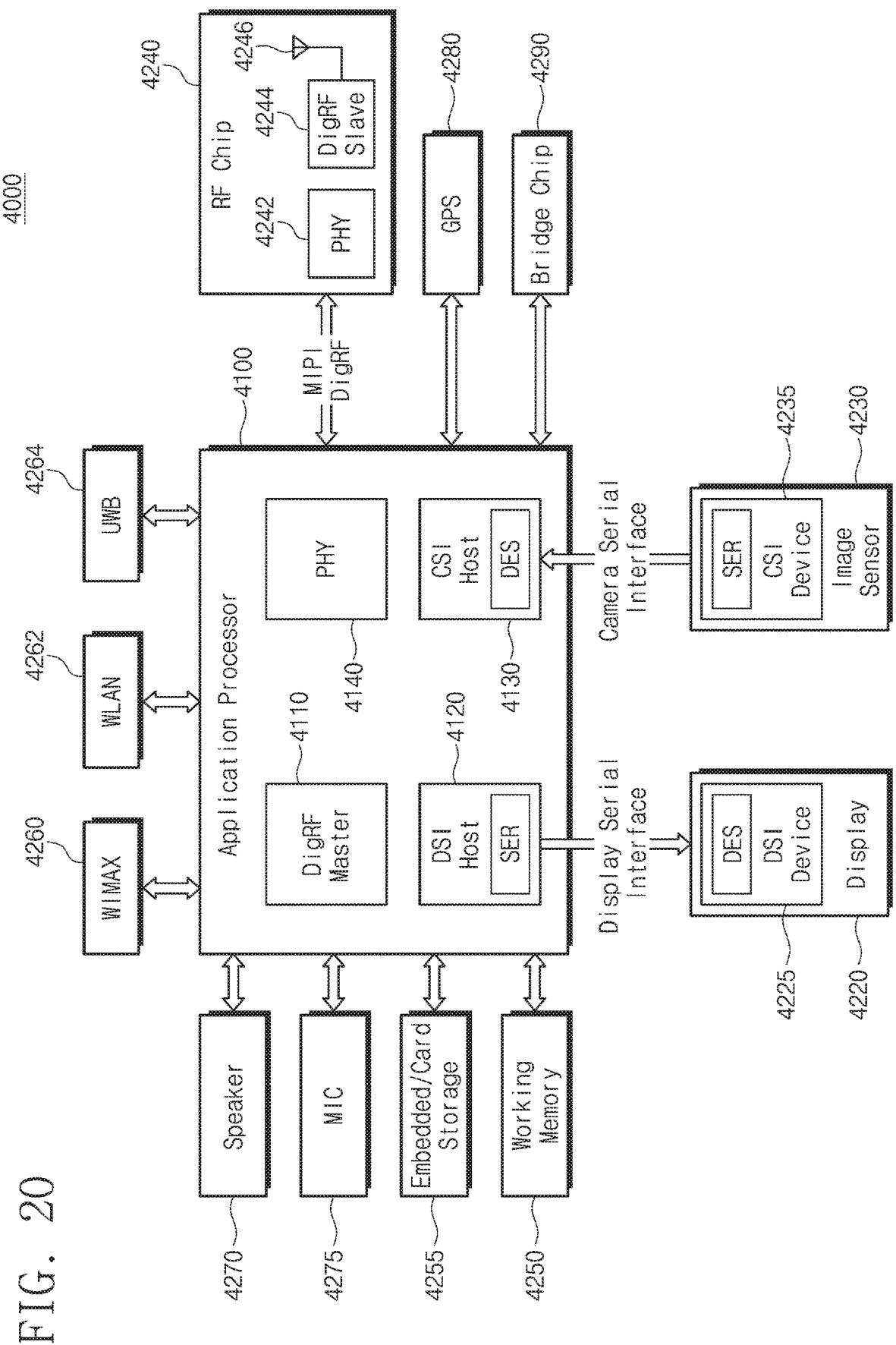
FIG. 20 is a block diagram illustrating an electronic system to which a transmitter and a receiver having a pulse width controller according to an example embodiment of the inventive concepts are applied.

FIG. 20 is a block diagram illustrating an electronic system to which a transmitter and a receiver having a pulse width controller according to an example embodiment of the inventive concepts are applied. Referring to FIG. 20, in an example embodiment, an electronic system 4000 may be implemented in the form of a portable communication terminal, a personal digital assistant (PDA), a portable multimedia player (PMP), a smartphone, or a wearable device or in the form of a computing system such as a personal computer, a server, a workstation, or a notebook computer.

The electronic system 4000 may include an application processor 4100 (or a central processing unit), a display 4220, and an image sensor 4230. The application processor 4100 may include a DigRF master 4110, a display serial interface (DSI) host 4120, a camera serial interface (CSI) host 4130, and a physical layer 4140.

The DSI host 4120 may communicate with a DSI device 4225 of the display 4220 through the DSI. In an example embodiment, an optical serializer SER may be implemented in the DSI host 4120. For example, an optical deserializer DES may be implemented in the DSI device 4225. The CSI host 4130 may communicate with a CSI device 4235 of the image sensor 4230 through the CSI. In an example embodiment, an optical deserializer DES may be implemented in the CSI host 4130. For example, an optical serializer SER may be implemented in the CSI device 4235.

The electronic system 4000 may further include a radio frequency (RF) chip 4240 for communicating with the application processor 4100. The RF chip 4240 may include a physical layer 4242, a DigRF slave 4244, and an antenna 4246. In an example embodiment, the physical layer 4242 of the RF chip 4240 and the physical layer 4140 of the application processor 4100 may exchange data with each other through an MIPI DigRF interface.

The electronic system 4000 may further include a working memory 4250 and embedded/card storage 4255. The working memory 4250 and the embedded/card storage 4255 may store data received from the application processor 4100. The working memory 4250 and the embedded/card storage 4255 may provide the data stored therein to the application processor 4100.

The working memory 4250 may temporarily store data which are processed or will be processed by the application processor 4100. The working memory 4250 may include a volatile memory such as a static random access memory (SRAM), a dynamic RAM (DRAM), or a synchronous DRAM (SDRAM), or a nonvolatile memory such as a flash memory, a PRAM, a MRAM, a ReRAM, or a FRAM. The embedded/card storage 4255 may store data regardless of whether a power is supplied.

The electronic system 4000 may communicate with an external system through a worldwide interoperability for microwave access (WiMAX) 4260, a wireless local area network (WLAN) 4262, and an ultra-wideband (UWB) 4264.

The electronic system 4000 may further include a speaker 4270 and a microphone 4275 for processing voice information. The electronic system 4000 may further include a global positioning system (GPS) device 4280 for processing position information. The electronic system 4000 may further include a bridge chip 4290 for managing connections between peripheral devices.

In an example embodiment, each of components of the electronic system 400 or each unit included in the components may adjust a pulse width of a received signal by using a pulse width controller according to the inventive concepts, or may adjust a pulse width of a signal in advance by using a pulse width controller according to the inventive concepts and may transmit the signal having the adjusted pulse width.

According to an example embodiment of the inventive concepts, an electronic device may adjust a pulse width of a data signal corresponding to a current data bit based on previous data bits. Accordingly, an operation method of a signal receiver having improved reliability, a pulse width controller, and an electronic device including the signal receiver and the pulse width controller are provided.

According to one or more example embodiments, the units and/or devices described above including elements of the pulse width controller 100, 200, 300, 400 such as, for example, the control logic, delay signal generators, and pulse width controlled decision feedback generators (PWC-DFEs) and sub-elements thereof (e.g., the pulse width adjustor, the sampler, the first to m-th delays) may be implemented using hardware, a combination of hardware and software, or a non-transitory storage medium storing software that is executable to perform the functions of the same.

Hardware may be implemented using processing circuitry such as, but not limited to, one or more processors, one or more Central Processing Units (CPUs), one or more controllers, one or more arithmetic logic units (ALUs), one or more digital signal processors (DSPs), one or more microcomputers, one or more field pro0grammable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

While example embodiments the inventive concepts has been described with reference to some example embodiments thereof, it will be apparent to those of ordinary skill in the art that various changes and modifications may be made thereto without departing from the spirit and scope of the inventive concept as set forth in the following claims.

What is claimed is:

1. An operation method of a signal receiver, the method comprising:
    sequentially receiving a 0-th bit and a first bit through a signal line; and
    adjusting a width of one of a first high duration and a first low duration of a first output signal corresponding to the first bit, based on values of the 0-th bit and the first bit, in response to the values of the 0-th bit and the first bit being identical.

2. The method of claim 1, wherein
the first low duration of the first output signal increases when the values of the 0-th bit and the first bit are logical high, and
the first high duration of the first output signal increases when the values of the 0-th bit and the first bit are logical low.

3. The method of claim 1, further comprising:
receiving a second bit after receipt of the 0-th bit and the first bit;
adjusting the width of one of a second high duration and a second low duration of a second output signal corresponding to the second bit based on the values of the 0-th bit and the first bit, in response to the 0-th bit and the first bit being identical; and
adjusting the width of one of the second high duration and the second low duration of the second output signal based on the value of the first bit and a value of the second bit, in response to the first bit and the second bit being identical.

4. The method of claim 3, wherein
the second low duration of the second output signal increases when the values of the 0-th bit and the first bit are logical high or when the values of the first bit and the second bit are logical high, and
the second high duration of the second output signal increases when the values of the 0-th bit and the first bit are logical low or when the values of the first bit and the second bit are logical low.

5. The method of claim 3, wherein
the width of one of the second high duration and the second low duration of the second output signal increases by a first amount when the 0-th bit to the second bit have a same value, and
the width of one of the second high duration and the second low duration of the second output signal increases by a second amount shorter than the first amount when one of the 0-th bit to the second bit are different from remaining bits.

6. The method of claim 3, wherein the width of the second high duration and the width of the second low duration of the second output signal are not adjusted when the 0-th bit and the first bit are different from each other and the first bit and the second bit are different from each other.

7. A pulse width controller comprising:
an interface configured to receive a signal; and
processing circuitry configured to,
sample an output signal to output a 0-th feedback signal,
delay the 0-th feedback signal to output a first feedback signal,
adjust a width of one of a high duration and a low duration of the output signal, in response to values of the 0-th feedback signal and the first feedback signal being identical.

8. The pulse width controller of claim 7, wherein the signal is associated with a plurality of bits received through a same line, the processing circuitry is configured to,
output a plurality of delay signals based on the signal.

9. The pulse width controller of claim 8, wherein the processing circuitry includes:
a plurality of inverter circuits configured to receive respective ones of the plurality of delay signals, and to output respective ones of a plurality of inverted delay signals;
a pull-up driver configured to adjust a width of the high duration of the output signal based on the plurality of inverted delay signals, the 0-th feedback signal and the first feedback signal; and
a pull-down driver configured to adjust a width of the low duration of the output signal based on the plurality of inverted delay signals, the 0-th feedback signal and the first feedback signal.

10. The pulse width controller of claim 9, wherein the processing circuitry is configured to,
generate at least one delay coefficient and at least one adjustment coefficient, and
output the plurality of delay signals based on the at least one delay coefficient, and wherein
the pull-up driver and the pull-down driver control the width of the high duration and the width of the low duration of the output signal based on the at least one adjustment coefficient.

11. The pulse width controller of claim 8, wherein the processing circuitry is configured to,
increase a width of the low duration of the output signal based on the plurality of delay signals when the 0-th feedback signal and the first feedback signal are both logical high, and
increase a width of the high duration of the output signal based on the plurality of delay signals when the 0-th feedback signal and the first feedback signal are both logical low.

12. The pulse width controller of claim 8, wherein the processing circuitry is further configured to,
delay the first feedback signal to output a second feedback signal,
increase a width of the low duration of the output signal based on the plurality of delay signals when the 0-th feedback signal and the first feedback signal are logical high or when the first feedback signal and the second feedback signal are logical high, and
increase a width of the high duration of the output signal based on the plurality of delay signals when the 0-th feedback signal and the first feedback signal are logical low or when the first feedback signal and the second feedback signal are logical low.

13. The pulse width controller of claim 12, wherein
the plurality of bits include a 0-th bit, a first bit and a second bit,
the 0-th bit to the second bit are sequentially received via the interface through the same line, and
the 0-th feedback signal corresponds to the second bit, the first feedback signal corresponds to the first bit, and the second feedback signal corresponds to the 0-th bit.

14. An electronic device comprising:
a delay signal generator configured to sequentially receive a signal having a 0-th bit, a first bit and a second bit, and to delay the signal to generate a plurality of delay signals; and
a pulse width controlled decision feedback equalizer configured to adjust a width of one of a high duration and a low duration of an output signal based on the plurality of delay signals in response to (i) the 0-th bit and the first bit being identical or (ii) the first bit and the second bit being identical.

15. The electronic device of claim 14, wherein the pulse width controlled decision feedback equalizer is configured to,
  increase a width of the low duration of the output signal when the 0-th bit and the first bit are logical high or when the first bit and the second bit are logical high, and
  increase a width of the high duration of the output signal when a 0-th feedback signal and a first feedback signal are logical low or when the first feedback signal and a second feedback signal are logical low.

16. The electronic device of claim 14, wherein the pulse width controlled decision feedback equalizer is configured to,
  increase a width of one of the high duration and the low duration of the output signal by a first amount when the 0-th bit to the second bit are identical, and
  increase a width of one of the high duration and the low duration of the output signal by a second amount shorter than the first amount (i) when the 0-th bit and the first bit are identical and the first bit and the second bit are different or (ii) when the 0-th bit and the first bit are different and the first bit and the second bit are identical.

17. The electronic device of claim 14, further comprising:
  control logic configured to provide at least one delay coefficient to the delay signal generator, and to provide at least one adjustment coefficient to the pulse width controlled decision feedback equalizer, wherein
  the delay signal generator is configured to output the plurality of delay signals based on the at least one delay coefficient, and
  the pulse width controlled decision feedback equalizer is configured to adjust a width of one of the high duration and the low duration of the output signal based on the at least one adjustment coefficient.

18. The electronic device of claim 14, wherein the pulse width controlled decision feedback equalizer includes:
  a sampler configured to sample the output signal to output a 0-th feedback signal corresponding to the second bit;
  a first delay configured to delay the 0-th feedback signal to output a first feedback signal corresponding to the first bit;
  a second delay configured to delay the first feedback signal to output a second feedback signal corresponding to the 0-th bit; and
  a pulse width controller configured to,
    receive the plurality of delay signals and the 0-th to second feedback signals, and
    adjust a width of one of the high duration and the low duration of the output signal when the 0-th feedback signal and the first feedback signal are identical or when the first feedback signal and the second feedback signal are identical.

19. The electronic device of claim 14, wherein the pulse width controlled decision feedback equalizer includes:
  a first flip-flop configured to receive a first output signal of the output signal, and to output a first feedback signal in response to a clock signal;
  a second flip-flop configured to receive a second output signal of the output signal, and to output a second feedback signal in response to an inverted clock signal obtained by inverting the clock signal;
  a third flip-flop configured to receive the first feedback signal, and to output a third feedback signal in response to the inverted clock signal;
  a fourth flip-flop configured to receive the second feedback signal, and to output a fourth feedback signal in response to the clock signal;
  a first pulse width controller configured to output the first output signal based on the first feedback signal, the second feedback signal, the third feedback signal, the fourth feedback signal and the plurality of delay signals; and
  a second pulse width controller configured to output the second output signal based on the first feedback signal, the second feedback signal, the third feedback signal, the fourth feedback signal and the plurality of delay signals.

20. The electronic device of claim 14, wherein the pulse width controlled decision feedback equalizer includes:
  a 0-th pulse width controller configured to generate a 0-th intermediate signal based on the plurality of delay signals, in response to a ground voltage and a power supply voltage;
  a first pulse width controller configured to generate a first intermediate signal based on the plurality of delay signals, in response to the power supply voltage;
  a second pulse width controller configured to generate a second intermediate signal based on the plurality of delay signals, in response to the ground voltage;
  a first flip-flop configured to receive a first output signal of the output signal, and to output a first feedback signal in response to a clock signal;
  a second flip-flop configured to receive a second output signal of the output signal, and to output a second feedback signal in response to an inverted clock signal obtained by inverting the clock signal;
  a first multiplexer configured to output one of the 0-th intermediate signal, the first intermediate signal and the second intermediate signal as the first output signal based on the first feedback signal and the second feedback signal; and
  a second multiplexer configured to output one of the 0-th intermediate signal, the first intermediate signal and the second intermediate signal as the second output signal based on the first feedback signal and the second feedback signal.

* * * * *